(12) United States Patent
Ciesla et al.

(10) Patent No.: US 8,922,502 B2
(45) Date of Patent: Dec. 30, 2014

(54) USER INTERFACE SYSTEM

(75) Inventors: Craig Michael Ciesla, Mountain View, CA (US); Micah B. Yairi, Palo Alto, CA (US); Nathaniel Mark Saal, Palo Alto, CA (US)

(73) Assignee: Tactus Technology, Inc., Fremont, CA (US)

( * ) Notice: Subject to any disclaimer, the term of this patent is extended or adjusted under 35 U.S.C. 154(b) by 1042 days.

(21) Appl. No.: 12/975,329

(22) Filed: Dec. 21, 2010

(65) Prior Publication Data

US 2011/0148793 A1    Jun. 23, 2011

Related U.S. Application Data

(63) Continuation-in-part of application No. 12/497,622, filed on Jul. 3, 2009, now Pat. No. 8,179,375, which is a continuation-in-part of application No. 12/319,334, filed on Jan. 5, 2009, now Pat. No. 8,154,527, which is a continuation-in-part of application No. 11/969,848, filed on Jan. 4, 2008.

(60) Provisional application No. 61/288,824, filed on Dec. 21, 2009.

(51) Int. Cl.

| G06F 3/041 | (2006.01) |
| G09G 5/00 | (2006.01) |
| G06F 3/02 | (2006.01) |
| G06F 3/0354 | (2013.01) |
| G06F 3/0488 | (2013.01) |
| G06F 3/0489 | (2013.01) |
| H03K 17/967 | (2006.01) |

(52) U.S. Cl.
CPC .......... *G06F 3/0202* (2013.01); *G06F 3/03547* (2013.01); *G06F 3/04886* (2013.01); *G06F 3/04895* (2013.01); *H03K 17/967* (2013.01); *G06F 2203/04809* (2013.01)
USPC .......................................... 345/173; 345/156

(58) Field of Classification Search
CPC .................. G06F 2203/04809; G06F 3/04895; G06F 3/016; G06F 3/044; G06F 3/04883; G06F 3/04886; G06F 3/0414; G06F 3/0202; G06F 3/03547; G09B 21/003–21/004; H01H 2215/046
USPC ............. 345/156–184, 104; 178/18.01–20.04
See application file for complete search history.

(56) References Cited

U.S. PATENT DOCUMENTS

| 3,034,628 A | 5/1962 | Wadey |
| 3,659,354 A | 5/1972 | Sutherland |

(Continued)

FOREIGN PATENT DOCUMENTS

| CN | 1260525 A | 7/2000 |
| JP | 10255106 | 9/1998 |

(Continued)

OTHER PUBLICATIONS

Optical Society of America, Optics Express; vol. 12, No. 11. May 31, 2004, 7 Pages, Jeong, Ki-Hun , et al. "Tunable Microdoublet Lens Array".

(Continued)

*Primary Examiner* — Patrick F Marinelli
(74) *Attorney, Agent, or Firm* — Jeffrey Schox

(57) ABSTRACT

A user interface system for receiving a user input that includes sheet that defines a surface and at least partially defines a fluid vessel arranged underneath the surface, a volume of fluid within the fluid vessel, a displacement device that influences the volume of the fluid within the fluid vessel to expand and retract at least a portion of the fluid vessel, thereby deforming a particular region of the surface, and an electrical sensor coupled to the sheet that receives an input provided by a user that inwardly deforms the surface of the sheet and that includes a first conductor and a second conductor that are electrically coupled to each other with an electrical property that changes as the distance between the first and second conductors changes.

30 Claims, 10 Drawing Sheets

(56) References Cited

U.S. PATENT DOCUMENTS

| | | |
|---|---|---|
| 3,759,108 A | 9/1973 | Borom et al. |
| 3,780,236 A | 12/1973 | Gross |
| 3,818,487 A | 6/1974 | Brody et al. |
| 4,109,118 A | 8/1978 | Kley |
| 4,209,819 A | 6/1980 | Seignemartin |
| 4,290,343 A | 9/1981 | Gram |
| 4,307,268 A | 12/1981 | Harper |
| 4,467,321 A | 8/1984 | Volnak |
| 4,477,700 A | 10/1984 | Balash et al. |
| 4,517,421 A | 5/1985 | Margolin |
| 4,543,000 A | 9/1985 | Hasenbalg |
| 4,700,025 A | 10/1987 | Hatayama et al. |
| 4,920,343 A | 4/1990 | Schwartz |
| 5,194,852 A | 3/1993 | More et al. |
| 5,195,659 A | 3/1993 | Eiskant |
| 5,212,473 A | 5/1993 | Louis |
| 5,286,199 A | 2/1994 | Kipke |
| 5,412,189 A | 5/1995 | Cragun |
| 5,459,461 A | 10/1995 | Crowley et al. |
| 5,488,204 A | 1/1996 | Mead et al. |
| 5,496,174 A * | 3/1996 | Garner ..................... 434/114 |
| 5,666,112 A | 9/1997 | Crowley et al. |
| 5,717,423 A | 2/1998 | Parker |
| 5,729,222 A | 3/1998 | Iggulden et al. |
| 5,742,241 A | 4/1998 | Crowley et al. |
| 5,754,023 A | 5/1998 | Roston et al. |
| 5,766,013 A | 6/1998 | Vuyk |
| 5,767,839 A | 6/1998 | Rosenberg |
| 5,835,080 A | 11/1998 | Beeteson et al. |
| 5,880,411 A | 3/1999 | Gillespie et al. |
| 5,889,236 A | 3/1999 | Gillespie et al. |
| 5,943,043 A | 8/1999 | Furuhata et al. |
| 5,977,867 A | 11/1999 | Blouin |
| 5,982,304 A | 11/1999 | Selker et al. |
| 6,067,116 A | 5/2000 | Yamano et al. |
| 6,154,198 A | 11/2000 | Rosenberg |
| 6,154,201 A | 11/2000 | Levin et al. |
| 6,160,540 A | 12/2000 | Fishkin et al. |
| 6,169,540 B1 | 1/2001 | Rosenberg et al. |
| 6,188,391 B1 | 2/2001 | Seely et al. |
| 6,218,966 B1 | 4/2001 | Goodwin et al. |
| 6,243,074 B1 | 6/2001 | Fishkin et al. |
| 6,243,078 B1 | 6/2001 | Rosenberg |
| 6,268,857 B1 | 7/2001 | Fishkin et al. |
| 6,271,828 B1 | 8/2001 | Rosenberg et al. |
| 6,278,441 B1 | 8/2001 | Gouzman et al. |
| 6,300,937 B1 | 10/2001 | Rosenberg |
| 6,323,846 B1 | 11/2001 | Westerman et al. |
| 6,337,678 B1 | 1/2002 | Fish |
| 6,354,839 B1 | 3/2002 | Schmidt et al. |
| 6,356,259 B1 | 3/2002 | Maeda et al. |
| 6,359,572 B1 | 3/2002 | Vale |
| 6,366,272 B1 | 4/2002 | Rosenberg et al. |
| 6,369,803 B2 | 4/2002 | Brisebois et al. |
| 6,414,671 B1 | 7/2002 | Gillespie et al. |
| 6,429,846 B2 | 8/2002 | Rosenberg et al. |
| 6,437,771 B1 | 8/2002 | Rosenberg et al. |
| 6,462,294 B2 | 10/2002 | Davidson et al. |
| 6,469,692 B2 | 10/2002 | Rosenberg |
| 6,486,872 B2 | 11/2002 | Rosenberg et al. |
| 6,498,353 B2 | 12/2002 | Nagle et al. |
| 6,509,892 B1 | 1/2003 | Cooper et al. |
| 6,529,183 B1 | 3/2003 | Maclean et al. |
| 6,573,844 B1 | 6/2003 | Venolia et al. |
| 6,636,202 B2 | 10/2003 | Ishmael, Jr. et al. |
| 6,639,581 B1 | 10/2003 | Moore et al. |
| 6,655,788 B1 | 12/2003 | Freeman |
| 6,657,614 B1 | 12/2003 | Ito et al. |
| 6,681,031 B2 | 1/2004 | Cohen et al. |
| 6,686,911 B1 | 2/2004 | Levin et al. |
| 6,697,086 B2 | 2/2004 | Rosenberg et al. |
| 6,703,924 B2 | 3/2004 | Tecu et al. |
| 6,788,295 B1 | 9/2004 | Inkster |
| 6,819,316 B2 | 11/2004 | Schulz et al. |
| 6,850,222 B1 | 2/2005 | Rosenberg |
| 6,861,961 B2 | 3/2005 | Sandbach et al. |
| 6,877,986 B2 | 4/2005 | Fournier et al. |
| 6,881,063 B2 | 4/2005 | Yang |
| 6,930,234 B2 | 8/2005 | Davis |
| 6,937,225 B1 | 8/2005 | Kehlstadt et al. |
| 6,975,305 B2 | 12/2005 | Yamashita |
| 6,979,164 B2 | 12/2005 | Kramer |
| 6,982,696 B1 | 1/2006 | Shahoian |
| 6,995,745 B2 | 2/2006 | Boon et al. |
| 7,027,032 B2 | 4/2006 | Rosenberg et al. |
| 7,056,051 B2 | 6/2006 | Fiffie |
| 7,061,467 B2 | 6/2006 | Rosenberg |
| 7,064,655 B2 | 6/2006 | Murray et al. |
| 7,081,888 B2 | 7/2006 | Cok et al. |
| 7,096,852 B2 | 8/2006 | Gregorio |
| 7,102,541 B2 | 9/2006 | Rosenberg |
| 7,104,152 B2 | 9/2006 | Levin et al. |
| 7,106,305 B2 | 9/2006 | Rosenberg |
| 7,106,313 B2 | 9/2006 | Schena et al. |
| 7,109,967 B2 | 9/2006 | Hioki et al. |
| 7,112,737 B2 | 9/2006 | Ramstein |
| 7,113,166 B1 | 9/2006 | Rosenberg et al. |
| 7,116,317 B2 | 10/2006 | Gregorio et al. |
| 7,124,425 B1 | 10/2006 | Anderson, Jr. et al. |
| 7,129,854 B2 | 10/2006 | Arneson et al. |
| 7,131,073 B2 | 10/2006 | Rosenberg et al. |
| 7,136,045 B2 | 11/2006 | Rosenberg et al. |
| 7,138,977 B2 | 11/2006 | Kinerk et al. |
| 7,138,985 B2 | 11/2006 | Nakajima |
| 7,143,785 B2 | 12/2006 | Maerkl et al. |
| 7,144,616 B1 | 12/2006 | Unger et al. |
| 7,148,875 B2 | 12/2006 | Rosenberg et al. |
| 7,151,432 B2 | 12/2006 | Tierling |
| 7,151,527 B2 | 12/2006 | Culver |
| 7,151,528 B2 | 12/2006 | Taylor et al. |
| 7,154,470 B2 | 12/2006 | Tierling |
| 7,158,112 B2 | 1/2007 | Rosenberg et al. |
| 7,159,008 B1 | 1/2007 | Wies et al. |
| 7,161,276 B2 | 1/2007 | Face |
| 7,161,580 B2 | 1/2007 | Bailey et al. |
| 7,168,042 B2 | 1/2007 | Braun et al. |
| 7,176,903 B2 | 2/2007 | Katsuki et al. |
| 7,182,691 B1 | 2/2007 | Schena |
| 7,191,191 B2 | 3/2007 | Peurach et al. |
| 7,193,607 B2 | 3/2007 | Moore et al. |
| 7,195,170 B2 | 3/2007 | Matsumoto et al. |
| 7,196,688 B2 | 3/2007 | Schena |
| 7,198,137 B2 | 4/2007 | Olien |
| 7,199,790 B2 | 4/2007 | Rosenberg et al. |
| 7,202,851 B2 | 4/2007 | Cunningham et al. |
| 7,205,981 B2 | 4/2007 | Cunningham |
| 7,208,671 B2 | 4/2007 | Chu |
| 7,209,028 B2 | 4/2007 | Boronkay et al. |
| 7,209,117 B2 | 4/2007 | Rosenberg et al. |
| 7,209,118 B2 | 4/2007 | Shahoian et al. |
| 7,210,160 B2 | 4/2007 | Anderson, Jr. et al. |
| 7,215,326 B2 | 5/2007 | Rosenberg |
| 7,216,671 B2 | 5/2007 | Unger et al. |
| 7,218,310 B2 | 5/2007 | Tierling et al. |
| 7,218,313 B2 | 5/2007 | Marcus et al. |
| 7,233,313 B2 | 6/2007 | Levin et al. |
| 7,233,315 B2 | 6/2007 | Gregorio et al. |
| 7,233,476 B2 | 6/2007 | Goldenberg et al. |
| 7,236,157 B2 | 6/2007 | Schena et al. |
| 7,245,202 B2 | 7/2007 | Levin |
| 7,249,951 B2 | 7/2007 | Bevirt et al. |
| 7,250,128 B2 | 7/2007 | Unger et al. |
| 7,253,803 B2 | 8/2007 | Schena et al. |
| 7,253,807 B2 | 8/2007 | Nakajima |
| 7,265,750 B2 | 9/2007 | Rosenberg |
| 7,280,095 B2 | 10/2007 | Grant |
| 7,283,120 B2 | 10/2007 | Grant |
| 7,283,123 B2 | 10/2007 | Braun et al. |
| 7,289,106 B2 | 10/2007 | Bailey et al. |
| 7,289,111 B2 | 10/2007 | Asbill |
| 7,307,619 B2 | 12/2007 | Cunningham et al. |
| 7,308,831 B2 | 12/2007 | Cunningham et al. |
| 7,319,374 B2 | 1/2008 | Shahoian |
| 7,336,260 B2 | 2/2008 | Martin et al. |

(56) References Cited

U.S. PATENT DOCUMENTS

| | | | |
|---|---|---|---|
| 7,336,266 B2 | 2/2008 | Hayward et al. |
| 7,339,572 B2 | 3/2008 | Schena |
| 7,339,580 B2 | 3/2008 | Westerman et al. |
| 7,342,573 B2 | 3/2008 | Ryynanen |
| 7,355,595 B2 | 4/2008 | Bathiche et al. |
| 7,369,115 B2 | 5/2008 | Cruz-Hernandez et al. |
| 7,390,157 B2 | 6/2008 | Kramer |
| 7,391,861 B2 | 6/2008 | Levy |
| 7,397,466 B2 | 7/2008 | Bourdelais et al. |
| 7,403,191 B2 | 7/2008 | Sinclair |
| 7,432,910 B2 | 10/2008 | Shahoian |
| 7,432,911 B2 | 10/2008 | Skarine |
| 7,433,719 B2 | 10/2008 | Dabov |
| 7,489,309 B2 | 2/2009 | Levin et al. |
| 7,511,702 B2 | 3/2009 | Hotelling |
| 7,522,152 B2 | 4/2009 | Olien et al. |
| 7,545,289 B2 | 6/2009 | Mackey et al. |
| 7,548,232 B2 | 6/2009 | Shahoian et al. |
| 7,551,161 B2 | 6/2009 | Mann |
| 7,561,142 B2 | 7/2009 | Shahoian et al. |
| 7,567,232 B2 | 7/2009 | Rosenberg |
| 7,567,243 B2 | 7/2009 | Hayward |
| 7,592,999 B2 | 9/2009 | Rosenberg et al. |
| 7,605,800 B2 | 10/2009 | Rosenberg |
| 7,609,178 B2 | 10/2009 | Son et al. |
| 7,656,393 B2 | 2/2010 | King et al. |
| 7,671,837 B2 | 3/2010 | Forsblad et al. |
| 7,679,611 B2 | 3/2010 | Schena |
| 7,679,839 B2 | 3/2010 | Polyakov et al. |
| 7,688,310 B2 | 3/2010 | Rosenberg |
| 7,701,438 B2 | 4/2010 | Chang et al. |
| 7,728,820 B2 | 6/2010 | Rosenberg et al. |
| 7,733,575 B2 | 6/2010 | Heim et al. |
| 7,743,348 B2 | 6/2010 | Robbins et al. |
| 7,755,602 B2 | 7/2010 | Tremblay et al. |
| 7,808,488 B2 | 10/2010 | Martin et al. |
| 7,834,853 B2 | 11/2010 | Finney et al. |
| 7,843,424 B2 | 11/2010 | Rosenberg et al. |
| 7,864,164 B2 | 1/2011 | Cunningham et al. |
| 7,869,589 B2 | 1/2011 | Tuovinen |
| 7,890,257 B2 | 2/2011 | Fyke et al. |
| 7,890,863 B2 | 2/2011 | Grant et al. |
| 7,920,131 B2 | 4/2011 | Westerman |
| 7,924,145 B2 | 4/2011 | Yuk et al. |
| 7,944,435 B2 | 5/2011 | Rosenberg et al. |
| 7,956,770 B2 | 6/2011 | Klinghult et al. |
| 7,973,773 B2 | 7/2011 | Pryor |
| 7,978,181 B2 | 7/2011 | Westerman |
| 7,978,183 B2 | 7/2011 | Rosenberg et al. |
| 7,978,186 B2 | 7/2011 | Vassallo et al. |
| 7,979,797 B2 | 7/2011 | Schena |
| 7,982,720 B2 | 7/2011 | Rosenberg et al. |
| 7,986,303 B2 | 7/2011 | Braun et al. |
| 7,986,306 B2 | 7/2011 | Eich et al. |
| 7,989,181 B2 | 8/2011 | Blattner et al. |
| 7,999,660 B2 | 8/2011 | Cybart et al. |
| 8,002,089 B2 | 8/2011 | Jasso et al. |
| 8,004,492 B2 | 8/2011 | Kramer et al. |
| 8,013,843 B2 | 9/2011 | Pryor |
| 8,020,095 B2 | 9/2011 | Braun et al. |
| 8,022,933 B2 | 9/2011 | Hardacker et al. |
| 8,031,181 B2 | 10/2011 | Rosenberg et al. |
| 8,044,826 B2 | 10/2011 | Yoo |
| 8,047,849 B2 | 11/2011 | Ahn et al. |
| 8,049,734 B2 | 11/2011 | Rosenberg et al. |
| 8,059,104 B2 | 11/2011 | Shahoian et al. |
| 8,059,105 B2 | 11/2011 | Rosenberg et al. |
| 8,063,892 B2 | 11/2011 | Shahoian et al. |
| 8,063,893 B2 | 11/2011 | Rosenberg et al. |
| 8,068,605 B2 | 11/2011 | Holmberg |
| 8,077,154 B2 | 12/2011 | Emig et al. |
| 8,077,440 B2 | 12/2011 | Krabbenborg et al. |
| 8,077,941 B2 | 12/2011 | Assmann |
| 8,094,121 B2 | 1/2012 | Obermeyer et al. |
| 8,094,806 B2 | 1/2012 | Levy |
| 8,103,472 B2 | 1/2012 | Braun et al. |
| 8,106,787 B2 | 1/2012 | Nurmi |
| 8,115,745 B2 | 2/2012 | Gray |
| 8,123,660 B2 | 2/2012 | Kruse et al. |
| 8,125,347 B2 | 2/2012 | Fahn |
| 8,125,461 B2 | 2/2012 | Weber et al. |
| 8,130,202 B2 | 3/2012 | Levine et al. |
| 8,144,129 B2 | 3/2012 | Hotelling et al. |
| 8,144,271 B2 | 3/2012 | Han |
| 8,154,512 B2 | 4/2012 | Olien et al. |
| 8,154,527 B2 | 4/2012 | Ciesla et al. |
| 8,159,461 B2 | 4/2012 | Martin et al. |
| 8,162,009 B2 | 4/2012 | Chaffee |
| 8,164,573 B2 | 4/2012 | Dacosta et al. |
| 8,169,306 B2 | 5/2012 | Schmidt et al. |
| 8,169,402 B2 | 5/2012 | Shahoian et al. |
| 8,174,372 B2 | 5/2012 | Da Costa |
| 8,174,495 B2 | 5/2012 | Takashima et al. |
| 8,174,508 B2 | 5/2012 | Sinclair et al. |
| 8,174,511 B2 | 5/2012 | Takenaka et al. |
| 8,178,808 B2 | 5/2012 | Strittmatter |
| 8,179,375 B2 | 5/2012 | Ciesla et al. |
| 8,179,377 B2 | 5/2012 | Ciesla et al. |
| 8,188,989 B2 | 5/2012 | Levin et al. |
| 8,195,243 B2 | 6/2012 | Kim et al. |
| 8,199,107 B2 | 6/2012 | Xu et al. |
| 8,199,124 B2 | 6/2012 | Ciesla et al. |
| 8,203,094 B2 | 6/2012 | Mittleman et al. |
| 8,203,537 B2 | 6/2012 | Tanabe et al. |
| 8,207,950 B2 | 6/2012 | Ciesla et al. |
| 8,212,772 B2 | 7/2012 | Shahoian |
| 8,217,903 B2 | 7/2012 | Ma et al. |
| 8,217,904 B2 | 7/2012 | Kim |
| 8,223,278 B2 * | 7/2012 | Kim et al. ........................ 349/12 |
| 8,224,392 B2 | 7/2012 | Kim et al. |
| 8,228,305 B2 | 7/2012 | Pryor |
| 8,232,976 B2 | 7/2012 | Yun et al. |
| 8,243,038 B2 | 8/2012 | Ciesla et al. |
| 8,253,052 B2 | 8/2012 | Chen |
| 8,253,703 B2 | 8/2012 | Eldering |
| 8,279,172 B2 | 10/2012 | Braun et al. |
| 8,279,193 B1 | 10/2012 | Birnbaum et al. |
| 8,310,458 B2 | 11/2012 | Faubert et al. |
| 8,345,013 B2 | 1/2013 | Heubel et al. |
| 8,350,820 B2 | 1/2013 | Deslippe et al. |
| 8,362,882 B2 | 1/2013 | Heubel et al. |
| 8,363,008 B2 | 1/2013 | Ryu et al. |
| 8,367,957 B2 | 2/2013 | Strittmatter |
| 8,368,641 B2 | 2/2013 | Tremblay et al. |
| 8,378,797 B2 | 2/2013 | Pance et al. |
| 8,384,680 B2 | 2/2013 | Paleczny et al. |
| 8,390,594 B2 | 3/2013 | Modarres et al. |
| 8,395,587 B2 | 3/2013 | Cauwels et al. |
| 8,395,591 B2 | 3/2013 | Kruglick |
| 8,400,402 B2 | 3/2013 | Son |
| 8,400,410 B2 | 3/2013 | Taylor et al. |
| 2001/0008396 A1 | 7/2001 | Komata |
| 2002/0104691 A1 | 8/2002 | Kent et al. |
| 2002/0106614 A1 | 8/2002 | Prince et al. |
| 2002/0110237 A1 | 8/2002 | Krishnan |
| 2002/0149570 A1 | 10/2002 | Knowles et al. |
| 2003/0087698 A1 | 5/2003 | Nishiumi et al. |
| 2003/0179190 A1 | 9/2003 | Franzen |
| 2003/0206153 A1 | 11/2003 | Murphy |
| 2004/0001589 A1 | 1/2004 | Mueller et al. |
| 2004/0056876 A1 | 3/2004 | Nakajima |
| 2004/0056877 A1 | 3/2004 | Nakajima |
| 2004/0114324 A1 | 6/2004 | Kusaka et al. |
| 2004/0164968 A1 | 8/2004 | Miyamoto |
| 2004/0178006 A1 | 9/2004 | Cok |
| 2005/0007349 A1 | 1/2005 | Vakil et al. |
| 2005/0020325 A1 | 1/2005 | Enger et al. |
| 2005/0110768 A1 | 5/2005 | Marriott et al. |
| 2005/0231489 A1 | 10/2005 | Ladouceur et al. |
| 2005/0253816 A1 | 11/2005 | Himberg et al. |
| 2006/0026521 A1 | 2/2006 | Hotelling et al. |
| 2006/0087479 A1 | 4/2006 | Sakurai et al. |
| 2006/0097991 A1 | 5/2006 | Hotelling et al. |
| 2006/0098148 A1 | 5/2006 | Kobayashi et al. |

(56) References Cited

U.S. PATENT DOCUMENTS

| | | |
|---|---|---|
| 2006/0118610 A1 | 6/2006 | Pihlaja et al. |
| 2006/0152474 A1 | 7/2006 | Saito et al. |
| 2006/0154216 A1 | 7/2006 | Hafez et al. |
| 2006/0197753 A1 | 9/2006 | Hotelling |
| 2006/0214923 A1 | 9/2006 | Chiu et al. |
| 2006/0238495 A1 | 10/2006 | Davis |
| 2006/0238510 A1* | 10/2006 | Panotopoulos et al. ....... 345/168 |
| 2006/0256075 A1 | 11/2006 | Anastas et al. |
| 2007/0013662 A1 | 1/2007 | Fauth |
| 2007/0036492 A1 | 2/2007 | Lee |
| 2007/0085837 A1 | 4/2007 | Ricks et al. |
| 2007/0108032 A1 | 5/2007 | Matsumoto et al. |
| 2007/0122314 A1 | 5/2007 | Strand et al. |
| 2007/0130212 A1 | 6/2007 | Peurach et al. |
| 2007/0152983 A1 | 7/2007 | McKillop et al. |
| 2007/0165004 A1 | 7/2007 | Seelhammer et al. |
| 2007/0171210 A1 | 7/2007 | Chaudhri et al. |
| 2007/0229233 A1 | 10/2007 | Dort |
| 2007/0236469 A1 | 10/2007 | Woolley et al. |
| 2007/0247429 A1 | 10/2007 | Westerman |
| 2007/0273561 A1 | 11/2007 | Philipp |
| 2007/0296702 A1 | 12/2007 | Strawn et al. |
| 2007/0296709 A1 | 12/2007 | GuangHai |
| 2008/0010593 A1 | 1/2008 | Uusitalo et al. |
| 2008/0024459 A1 | 1/2008 | Poupyrev et al. |
| 2008/0054875 A1 | 3/2008 | Saito |
| 2008/0062151 A1 | 3/2008 | Kent |
| 2008/0136791 A1 | 6/2008 | Nissar |
| 2008/0138774 A1 | 6/2008 | Ahn et al. |
| 2008/0143693 A1 | 6/2008 | Schena |
| 2008/0150911 A1 | 6/2008 | Harrison |
| 2008/0165139 A1 | 7/2008 | Hotelling et al. |
| 2008/0248836 A1 | 10/2008 | Caine |
| 2008/0251368 A1 | 10/2008 | Holmberg et al. |
| 2008/0286447 A1 | 11/2008 | Alden et al. |
| 2008/0303796 A1 | 12/2008 | Fyke |
| 2009/0002328 A1 | 1/2009 | Ullrich et al. |
| 2009/0002337 A1 | 1/2009 | Chang |
| 2009/0009480 A1 | 1/2009 | Heringslack |
| 2009/0015547 A1 | 1/2009 | Franz et al. |
| 2009/0033617 A1 | 2/2009 | Lindberg et al. |
| 2009/0085878 A1 | 4/2009 | Heubel et al. |
| 2009/0106655 A1 | 4/2009 | Grant et al. |
| 2009/0115733 A1 | 5/2009 | Ma et al. |
| 2009/0115734 A1 | 5/2009 | Fredriksson et al. |
| 2009/0128503 A1 | 5/2009 | Grant et al. |
| 2009/0129021 A1 | 5/2009 | Dunn |
| 2009/0135145 A1 | 5/2009 | Chen et al. |
| 2009/0140989 A1 | 6/2009 | Ahlgren |
| 2009/0160813 A1 | 6/2009 | Takashima et al. |
| 2009/0167508 A1 | 7/2009 | Fadell et al. |
| 2009/0167509 A1 | 7/2009 | Fadell et al. |
| 2009/0167567 A1 | 7/2009 | Halperin et al. |
| 2009/0167677 A1 | 7/2009 | Kruse et al. |
| 2009/0167704 A1 | 7/2009 | Terlizzi et al. |
| 2009/0174673 A1* | 7/2009 | Ciesla ........................ 345/173 |
| 2009/0181724 A1 | 7/2009 | Pettersson |
| 2009/0182501 A1 | 7/2009 | Fyke et al. |
| 2009/0195512 A1 | 8/2009 | Pettersson |
| 2009/0207148 A1 | 8/2009 | Sugimoto et al. |
| 2009/0215500 A1 | 8/2009 | You et al. |
| 2009/0243998 A1 | 10/2009 | Wang |
| 2009/0250267 A1 | 10/2009 | Heubel et al. |
| 2009/0289922 A1 | 11/2009 | Henry |
| 2009/0303022 A1 | 12/2009 | Griffin et al. |
| 2009/0309616 A1 | 12/2009 | Klinghult |
| 2010/0043189 A1 | 2/2010 | Fukano |
| 2010/0073241 A1 | 3/2010 | Ayala et al. |
| 2010/0097323 A1 | 4/2010 | Edwards et al. |
| 2010/0103116 A1 | 4/2010 | Leung et al. |
| 2010/0109486 A1 | 5/2010 | Polyakov et al. |
| 2010/0121928 A1 | 5/2010 | Leonard |
| 2010/0162109 A1 | 6/2010 | Chatterjee et al. |
| 2010/0177050 A1 | 7/2010 | Heubel et al. |
| 2010/0182245 A1 | 7/2010 | Edwards et al. |
| 2010/0232107 A1 | 9/2010 | Dunn |
| 2010/0237043 A1 | 9/2010 | Garlough |
| 2010/0295820 A1 | 11/2010 | Kikin-Gil |
| 2010/0296248 A1 | 11/2010 | Campbell et al. |
| 2010/0298032 A1 | 11/2010 | Lee et al. |
| 2011/0001613 A1 | 1/2011 | Ciesla et al. |
| 2011/0011650 A1* | 1/2011 | Klinghult ................. 178/18.03 |
| 2011/0018813 A1 | 1/2011 | Kruglick |
| 2011/0029862 A1 | 2/2011 | Scott et al. |
| 2011/0043457 A1 | 2/2011 | Oliver et al. |
| 2011/0074691 A1 | 3/2011 | Causey et al. |
| 2011/0148807 A1 | 6/2011 | Fryer |
| 2011/0157056 A1 | 6/2011 | Karpfinger |
| 2011/0175844 A1 | 7/2011 | Berggren |
| 2011/0241442 A1 | 10/2011 | Mittleman et al. |
| 2011/0254709 A1 | 10/2011 | Ciesla et al. |
| 2012/0032886 A1 | 2/2012 | Ciesla et al. |
| 2012/0038583 A1 | 2/2012 | Westhues et al. |
| 2012/0043191 A1 | 2/2012 | Kessler et al. |
| 2012/0056846 A1 | 3/2012 | Zaliva |
| 2012/0062483 A1 | 3/2012 | Ciesla et al. |
| 2012/0098789 A1 | 4/2012 | Ciesla et al. |
| 2012/0105333 A1 | 5/2012 | Maschmeyer et al. |
| 2012/0193211 A1 | 8/2012 | Ciesla et al. |
| 2012/0200528 A1 | 8/2012 | Ciesla et al. |
| 2012/0200529 A1 | 8/2012 | Ciesla et al. |
| 2012/0206364 A1 | 8/2012 | Ciesla et al. |
| 2012/0218213 A1 | 8/2012 | Ciesla et al. |
| 2012/0218214 A1 | 8/2012 | Ciesla et al. |
| 2012/0223914 A1 | 9/2012 | Ciesla et al. |
| 2012/0235935 A1 | 9/2012 | Ciesla et al. |
| 2012/0242607 A1 | 9/2012 | Ciesla et al. |
| 2012/0306787 A1 | 12/2012 | Ciesla et al. |
| 2013/0019207 A1 | 1/2013 | Rothkopf et al. |

FOREIGN PATENT DOCUMENTS

| | | |
|---|---|---|
| JP | 2006268068 A | 10/2006 |
| JP | 2006285785 A | 10/2006 |
| JP | 2009064357 A | 3/2009 |
| KR | 100677624 B | 1/2007 |
| WO | 2004028955 A | 4/2004 |
| WO | 2008037275 A1 | 4/2008 |
| WO | 2009002605 A | 12/2008 |
| WO | 2009044027 A2 | 4/2009 |
| WO | 2009088985 A | 7/2009 |
| WO | 2010077382 A | 7/2010 |
| WO | 2010078596 A | 7/2010 |
| WO | 2010078597 A | 7/2010 |
| WO | 2011003113 A | 1/2011 |
| WO | 2011087816 A | 7/2011 |
| WO | 2011087817 A | 7/2011 |
| WO | 2011112984 A | 9/2011 |
| WO | 2011133604 A | 10/2011 |
| WO | 2011133605 A | 10/2011 |

OTHER PUBLICATIONS http://sharp-world.com/corporate/news/070831.html, Sharp Press Release, Aug. 31, 2007, 3 pages "Sharp Develops and Will Mass Produce New System LCD with Embedded Optical Sensors to Provide Input Capabilities Including Touch Screen and Scanner Functions".

Preumont, A. Vibration Control of Active Structures: An Introduction, Jul. 2011.

* cited by examiner

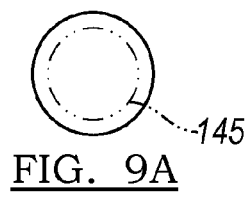
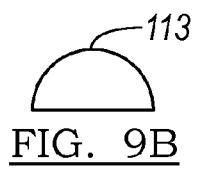
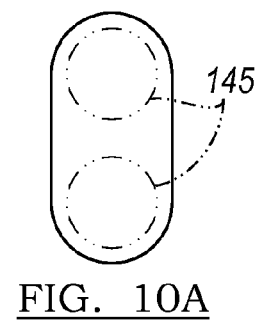
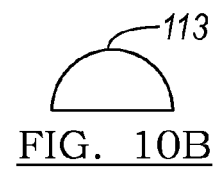
FIG. 9A
FIG. 9B
FIG. 10A
FIG. 10B
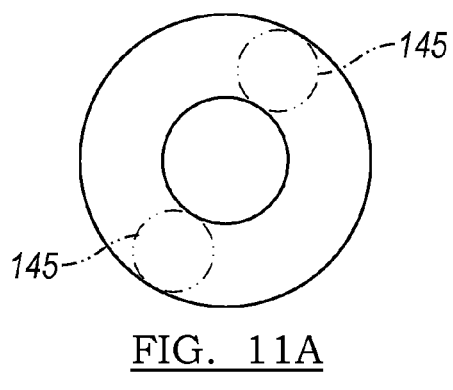
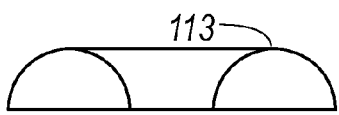
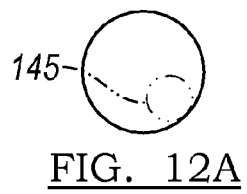
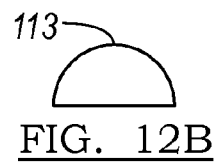
FIG. 11A
FIG. 11B
FIG. 12A
FIG. 12B
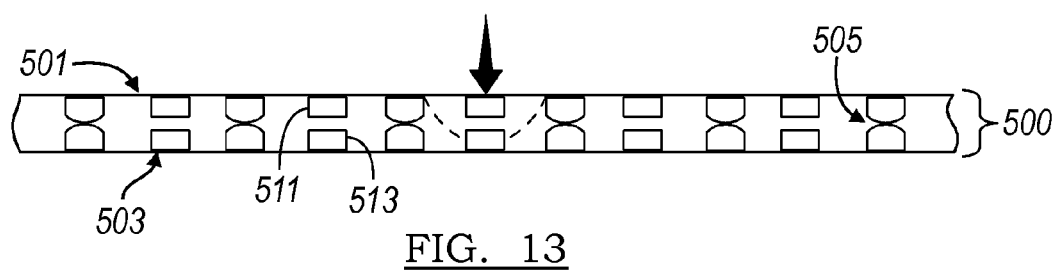
FIG. 13

USER INTERFACE SYSTEM

CROSS-REFERENCE TO RELATED APPLICATIONS

This application claims the benefit of U.S. Provisional Application No. 61/288,824, filed on 21 Dec. 2009, which is incorporated in its entirety by this reference.

This application is a continuation in part of prior U.S. application Ser. No. 12/497,622 filed on 3 Jul. 2009 and entitled "User Interface System and Method," which is a continuation in part of prior U.S. application Ser. No. 12/319,334 filed on 5 Jan. 2009 and entitled "User Interface System"and is also a continuation in part of prior U.S. application Ser. No. 11/969,848 filed on 4 Jan. 2008 and entitled "System and Method for Raised Tough Screens," which are incorporated in their entirety by this reference.

BRIEF DESCRIPTION OF THE FIGURES

FIGS. 9, 10, 11, and 12 are top and side views of a button deformation, a slider deformation, a slider ring deformation, a guide deformation, and a pointing stick deformation, respectively.

FIG. 13 is a schematic representation of a resistive touch layer.

DESCRIPTION OF THE PREFERRED EMBODIMENTS

The following description of the preferred embodiments of the invention is not intended to limit the invention to these preferred embodiments, but rather to enable any person skilled in the art to make and use this invention.

Figure 1A:
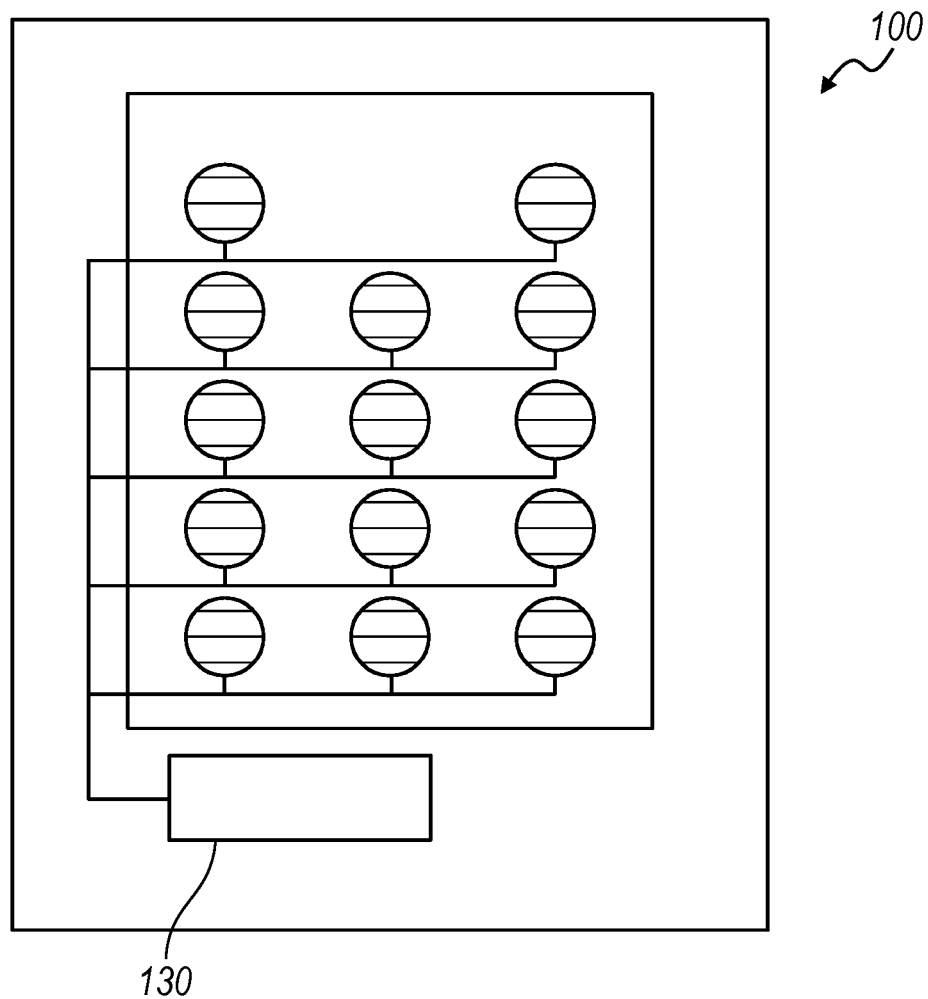
FIGS. 1a and 1b are a top view of the user interface system of a preferred embodiments and a cross-sectional view illustrating the operation of a button array in accordance with the preferred embodiments, respectively.
Figure 1B:
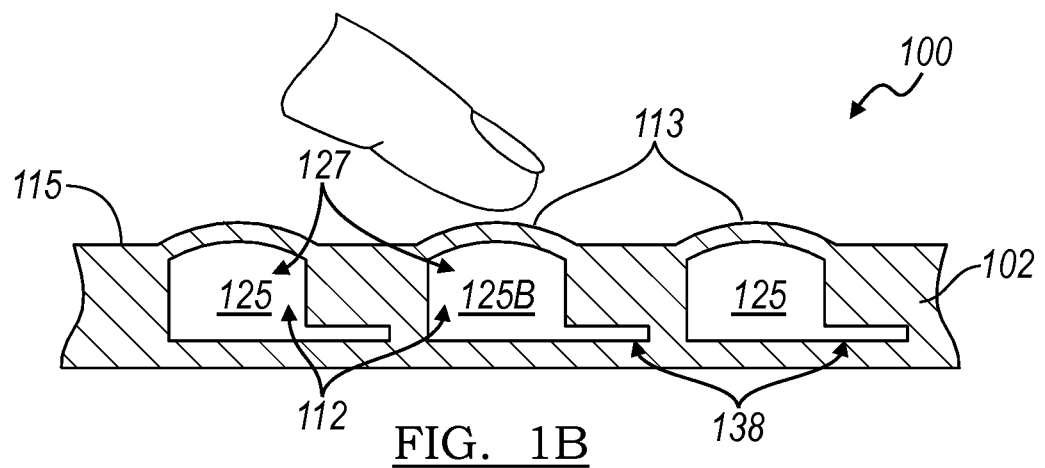
Figure 2A:
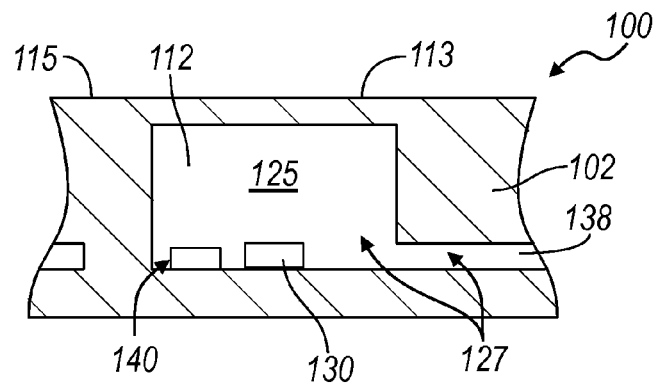
FIGS. 2a, 2b, and 2c are cross-sectional views of the retracted, extended, and user input modes of the preferred embodiments, respectively.
Figure 2B:
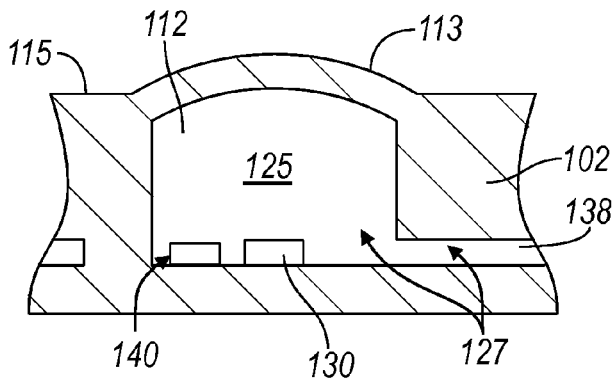
Figure 2C:
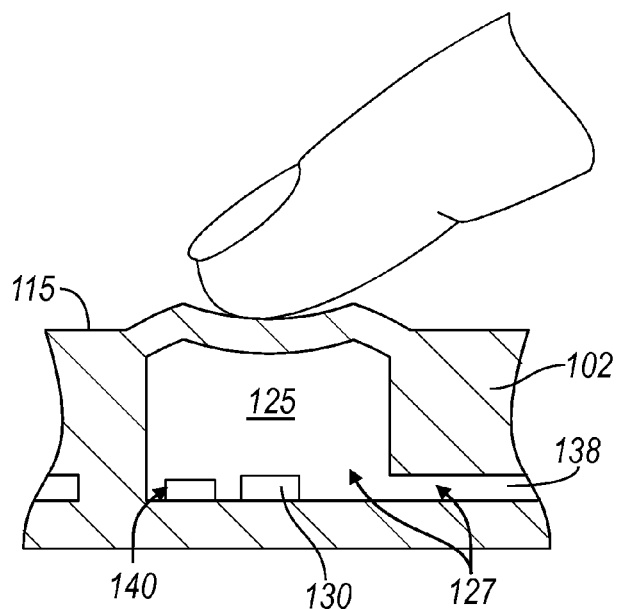
Figure 3:
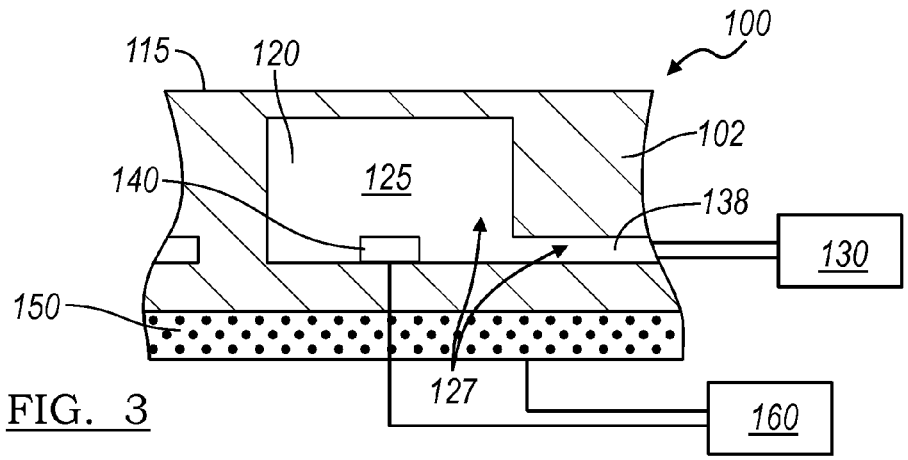
FIG. 3 is a cross-sectional view of the sheet, the fluid vessel, the sensor, the processor, and the display of the preferred embodiments.
Figure 4A:
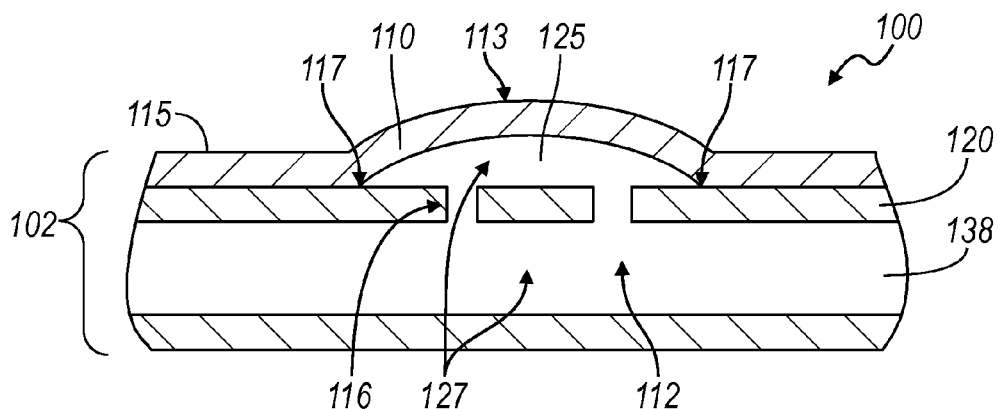
FIGS. 4a, 4b, and 4c is a cross-sectional view of a first variation of the sheet split into a layer portion and a substrate portion with fluid outlets from a side view and a top view and a second variation of the sheet split into a layer portion and a substrate portion with a fluid outlet, respectively.

As shown in FIGS. 1 and 2, the user interface system 100 of the preferred embodiments includes a sheet 102 that defines a surface 115 and a fluid vessel 127, a volume of a fluid 112 contained within the fluid vessel 127, a displacement device 130 that modifies the volume of the fluid 112 to expand at least a portion of the fluid vessel 127 (thereby outwardly deforming a particular region 113 of the surface 115), and a sensor 140 that receives an input provided by a user that inwardly deforms the surface 115. As shown in FIG. 3, the user interface system may also include a processor 160 that functions to detect the user input and/or to evaluate the user input received by the resistive sensor 140. The processor 160 is preferably coupled to the sensor 140 to receive signals from the resistive sensor 140. The processor 160 may also be coupled to the displacement device 130 to send signals to the displacement device 130. The user interface system 100 may also include a display 150 coupled to the sheet 102 and adapted to output images to the user. In this variation, the processor 160 may also be coupled to the display 150 to control the display 150. The sensor 140 may also be located in between the sheet 102 and the display 150 and may alternatively include a plurality of sensor components that are located in various locations within the user interface system 100. However, any other suitable arrangement of the components of the system 100 may be used. As shown in FIGURES 1b and 2, the fluid vessel 127 is preferably a cavity 125 and the displacement device 130 preferably influences the volume of fluid within the cavity 125 to expand and retract the cavity 125. The fluid vessel 127 may alternatively be a channel 138 or a combination of a channel 138 and a cavity 125, as shown in FIG. 4a. The fluid vessel 127 may also include a second cavity 125b that contains a volume of fluid 112 and the displacement device 130 preferably also influences the volume of the fluid within the second cavity 125b to expand and retract the second cavity 125b, thereby deforming a second particular region 113 of the surface 115. The displacement device 130 preferably influences the volume of fluid 112 within the second cavity 125b independently of the cavity 125, but may alternatively influence the volumes of fluid 112 within both cavity and second cavity 125 and 125b substantially concurrently. Alternatively, the user interface enhancement system 100 may include a second displacement device 130 that functions to influence the volume of fluid 112 within the second cavity 125b to expand and retract the second cavity 125b, thereby deforming a second particular region 113 of the surface. The second cavity 125b is preferably similar or identical to the cavity 125, but may alternatively be any other suitable type of cavity.

The user interface system 100 of the preferred embodiments has been specifically designed to be used as the user interface for an electronic device, more preferably in an electronic device that features an adaptive user interface. The electronic device, which may or may not include a display, may be an automotive console, a desktop computer, a laptop computer, a tablet computer, a television, a radio, a desk phone, a mobile phone, a PDA, a personal navigation device, a personal media player, a camera, a watch, a remote, a mouse, a trackpad, or a keyboard. The user interface system 100 may, however, be used as the user interface for any suitable device that interfaces with a user in a tactile and/or visual manner. As shown in FIG. 2, the surface 115 of the user interface system 100 preferably remains flat until a tactile guidance is to be provided at the location of the particular region 113. The surface 115 of the user interface system 100 may also be deformed when a user input is required. At that time, the displacement device 130 may increase the volume of the fluid within the fluid vessel 127 (or at the cavity 125) to deform and/or expand the particular region 113 outward, preferably forming a button-like shape. With the button-like shape, the user will have tactile guidance when navigating for the expanded particular region 113 and will have tactile feedback when applying force onto the particular region 113 to provide input. The resistive sensor 140 preferably senses the force that inwardly deforms the particular region 113, but may alternatively sense the force that inwardly deforms any other suitable region along the surface 115. However, any other arrangement of the user interface system 100 suitable to providing tactile guidance and/or detecting user input may be used.

As shown in FIG. 3, the user interface system 100 may be display 150 that displays an image. As described above, the volume of fluid 112 and/or the resistive sensor 140 preferably cooperates with the sheet 102 to transmit an image through the sheet 102 without substantial obstruction. Alternatively, the volume of fluid 112 may cooperate with the sheet 102 to transmit an image through the sheet 102 without substantial obstruction only when the fluid vessel 127 is in a particular state, for example, when the fluid vessel 127 is in the retracted state or when the fluid vessel is in the expanded state. Because the deformation of the particular region 113 functions to provide tactile guidance to the user, the user may not need the visual cues from the image to operate the user interface when tactile guidance is present. However, the volume of fluid 112 and the sheet 102 may cooperate to transmit an image through the sheet 102 without substantial obstruction in any other suitable arrangement. Obstruction to image transmission may be defined as any manipulation of the image that provides a visual interruption of the image in reaching the user. Obstruction may include blocking a substantial portion of the image, substantially dimming the image, and/or substantially distorting the image unintelligibly. Manipulations to an image that are preferably not considered obstruction to image transmission may include distortion of the image while allowing the image to be substantially visually intelligible, substantially uniformly tinting the image, and/or substantially uniformly enlarging the image. In a first variation, to decrease distortion of the image, the volume of fluid 112 and the sheet 102 preferably cooperate to allow the light from the display to reach the user's eyes at substantially the same angle from the sheet 102 as directly from the display 150 such that an image from the display is seen through the sheet 102 as it would be seen directly from the display. In a second variation, the volume of fluid 112 and sheet 102 may function to substantially uniformly refract light from the display to maintain substantially the same relative proportions between different regions of the image as seen by the user. For example, the volume of fluid 112 and the sheet 102 may cooperatively function to substantially magnify the image from the display of the device 10 thus increasing the size of the image as seen by the user uniformly or increasing the size of one portion of the image more than another portion. In a third variation, the volume of fluid 112 and sheet 102 may cooperate to refract light from different portions of the image differently (i.e., "warp" the image) to increase the magnification of certain portions of the image. For example, the fluid 112 and the sheet 102 may cooperate to provide a fish-eye type magnification to the image to substantially increase visibility of certain portions of the image. In the first, second, and third variations, the volume of fluid 112 and sheet 102 are preferably each of substantially the same index of refraction to maintain substantially one refraction angle of the light from the display as the light transmits through the sheet 102. Alternatively, the index of refraction of the volume of fluid 112 and the sheet 102 may be substantially different but the fluid 112 and sheet 102 preferably cooperate to decrease detection of the different refraction angles by the user. For example, the volume of fluid 112 may occupy a substantially small percentage of the thickness and/or width of the sheet 102 such that the change in refraction angle in the fluid 112 is substantially undetectable by the user. In a second example, the walls of the channel 138 and/or cavity 125 may be arranged to compensate for differences in the index of refraction between the fluid 112 and the sheet 102, for example, by positioning the walls at a particular angle relative to the sheet 102. Both the sheet 102 and the fluid 112 are preferably substantially transparent to decrease changes in the color and/or intensity of the image. Similarly, the sheet 102 and fluid 112 preferably both include substantially similar light absorptive properties, birefringence properties, and/or chromaticity properties. However, any other suitable translucency, transparency level, absorptive, refraction, and/or any other suitable light transmission properties may be used for the sheet 102 and fluid 112. Similarly, any other suitable method may be used to decrease obstruction to the transmission of an image.

1. The Sheet

As shown in FIGS. 1 and 2, the sheet 102 of the preferred embodiment functions to provide the surface 115 that interfaces with a user in a tactile manner and to at least partially a fluid vessel 127. As described above, the fluid vessel 127 is preferably a cavity 125 (as shown in FIGS. 1b and 2), but may alternatively be a channel 138 or a combination of a cavity 125 and a channel 138 (as shown in FIG. 4a). The surface 115 is preferably continuous, such that when swiping a finger across the surface 115 a user would not feel any interruptions or seams. Alternatively, the surface 115 may include features that facilitate the user in distinguishing one region from another. The surface 115 is also preferably planar. The surface 115 is preferably arranged in a flat plane, but may alternatively be arranged in a curved plane or on a first plane and then wrapped around to a second plane substantially perpendicular to the first plane, or any other suitable arrangement. The surface 115 may alternatively include lumps, bumps, depressions, textures, or may be a surface of any other suitable type or geometry. The surface 115 also functions to deform upon an expansion of the cavity 125, and to preferably "relax" or "un-deform" back to a normal planar state upon retraction of the cavity 125. In a first version, the sheet 102 contains a first portion that is elastic and a second portion that is relatively inelastic. In a second version, sheet 102 is relatively more elastic in a first portion and relatively less elastic in a second portion and is deformed by the expanded cavity 125 in the relatively more elastic portion. In the first and second version, the first portion and the second portion may be located across the length and width of the sheet 102. Alternatively, the first portion and the second portion may be located along the thickness of the sheet 102. In a third version, the sheet 102 is generally uniformly elastic. In fourth version, the sheet 102 includes or is made of a smart material, such as Nickel Titanium (commonly referred to as "Nitinol"), that has a selective shape and/or variable elasticity or a shape memory polymer that maybe activated, for example, by ultra violet light or any other suitable type of activation, to have selective shape and/or variable elasticity. The sheet 102 is preferably optically transparent, but may alternatively be translucent or opaque. In addition to the transparency, the sheet 102 preferably has the following properties: a high transmission, a low haze, a wide viewing angle, a minimal amount of back reflectance upon the display (if the display is included with the user interface system 100), minimal or low glare in ambient and/or daylight condition, scratch resistant, chemical resistant, stain resistant, relatively smooth (not tacky) to the touch, no out-gassing, and/or relatively low degradation rate when exposed to ultraviolet light. The material may also include properties that change during the usage of the device, for example, in the variation that utilizes shape memory polymer, usage of the device in an environment that includes a wavelength or wavelengths of light that may change the properties of the shape memory polymer desirably. For example, certain parts of the material may change elasticity when exposed to UV light. In a second example, the material may change shape. In this example, the volume of fluid 112 within the fluid vessel 127 preferably substantially conforms to the changed shape of the material. This may allow for light to transmit through the fluid 112 and the material without substantial obstruction. However, any other suitable dynamic physical property may be used. This change in the properties may be temporary, in particular, once the wavelength of light is no longer present, the material preferably reverts back to the original state. Alternatively, the change may be permanent. In this variation, the change is preferably reversible, for example, the material may revert back to the original state when exposed to another wavelength of light. In the variation wherein the sheet 102 is placed over a display, the sheet 102 may also function to decrease reflection and/or refraction of light emitting from the display. However, the sheet 102 may include any other suitable material property.

The sheet 102 is preferably made from a suitable elastic material, including polymers and silicone-based and urethane elastomers such as poly-dimethylsiloxane (PDMS) or RTV Silicone (e.g., Momentive RTV Silicone 615). The sheet 102 may also include coatings to provide properties such as smoothness (for example, low coefficient of friction), hydrophobic and oleophobic characteristics, scratch resistance, scratch concealing, and/or resistance to debris retention. The sheet 102 may also include coatings to provide desired optical properties, such as anti-reflection and anti-glare. Coatings may be applied on the surface 115, but may alternatively be applied on any other suitable surface of the sheet 102. In the version wherein the sheet 102 includes a first portion that is elastic and a second portion that is relatively inelastic, the inelastic portion is preferably made from a material including polymers or glass, for example, elastomers, silicone-based organic polymers such as poly-dimethylsiloxane (PDMS), thermoset plastics such as polymethyl methacrylate (PMMA), and photocurable solvent resistant elastomers such as perfluoropolyethers. The sheet 102 may, however, be made of any suitable material that provides the surface 115 that deforms and defines a fluid vessel 127.

Figure 4B:
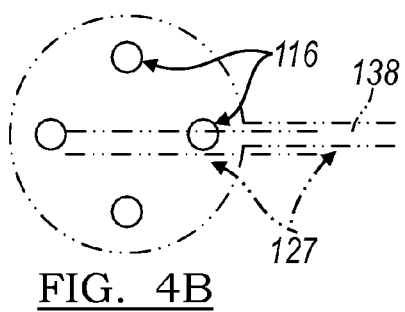
Figure 4C:
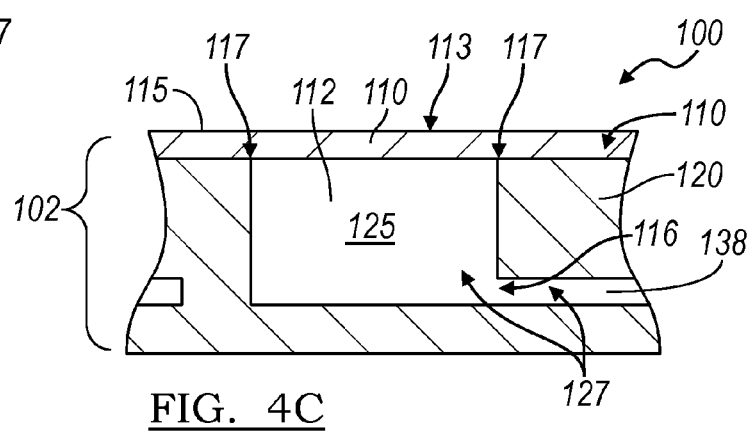

The sheet 102 may be manufactured using well-known techniques for micro-fluid arrays to create one or more cavities and/or micro channels. The sheet 102 may be constructed using multiple layers from the same material or from different suitable materials, for example, the sheet 102 may include a layer portion 110 of one material that defines the surface 115 and a substrate portion 120 of a second material (as shown in FIGS. 4a and 4c). As shown in FIGS. 4a and 4b, the substrate portion 120 preferably defines a fluid outlet 116 that allows fluid to flow between the channel 138 and the cavity 125 to deform and un-deform a particular region of the surface 113. The fluid outlet 116 may be formed into the substrate portion 120, for example, the fluid outlet 116 may be a series of bores that are formed into the substrate in between the channel 138 and the cavity 125 as shown in FIGS. 4a and 4b or an open orifice between the cavity 125 and the channel 138 as shown in FIG. 4c, but may alternatively be a property of the material, for example, the substrate portion 120 may include a porous material that includes a series of interconnected cavities that allow fluid to flow through the substrate portion 120. The substrate portion 120 may define any suitable number of fluid outlets 116 that are of any suitable size and shape. The substrate portion 120 may also include a fluid outlet layer that defines the fluid outlets 116 that is separate from substrate portion 120 and arranged in between the substrate portion 120 and layer portion 110. However, any other suitable arrangement of the fluid outlets 116 may be used. As shown in FIG. 4b, the portion of the substrate portion 120 (or fluid outlet layer) that includes the fluid outlets 116 may also function to provide a support for the layer portion 110 to substantially prevent the layer portion 110 from substantially depressing into the channel 138 when force is applied over the particular region 113. However, the substrate portion 120 may be arranged in any other suitable manner and may provide support for the layer portion 110 in any other suitable way.

The layer portion 110 is preferably attached to the substrate portion 120 (or fluid outlet layer) at an attachment point 117 that at least partially defines the size and/or shape of the particular region 113. In other words, the attachment point 117 functions to define a border between a deformable particular region of the surface 113 and the rest of the surface 115 and the size of the particular region 113 is substantially independent of the size of the cavity 124 and/or the channel 138. The attachment point 117 may be a series of continuous points that define an edge, but may alternatively be a series of non-continuous points. The attachment point 117 may be formed using, for example, adhesive, chemical bonding, surface activation, welding, or any other suitable attachment material and/or method. The method and material used to form the attachment point 117 is preferably of a similar optical property as the layer portion 110 and the substrate portion 120, but may alternatively be of any other optical property. Other portions of the layer portion 110 and substrate portion 120 not corresponding to a particular region of the surface 113 may also be adhered using similar or identical materials and methods to the attachment point 117. Alternatively, the layer portion 110 and substrate portion 120 may be left unattached in other portions not corresponding to a particular region of the surface 113. However, the sheet 102 may be arranged in any other suitable manner.

2. The Displacement Device

The displacement device 130 of the preferred embodiment functions to influence the volume of the fluid 112 to expand at least a portion of the fluid vessel 127 from the retracted volume setting to the extended volume setting and, ultimately, deforming a particular region 113 of the surface 115. The displacement device 130 preferably functions to expand at least a portion of the fluid vessel 127, but may alternatively function to contract at least a portion or any other suitable manipulation of at least a portion of the fluid vessel 127. The displacement device 130 preferably modifies the volume of the fluid 112 by (1) modifying the volume of the existing fluid in the fluid vessel 127, or (2) adding and removing fluid to and from the fluid vessel 127. The displacement device 130 may, however, influence the volume of the fluid 112 by any suitable device or method. Modifying the volume of the existing fluid in the fluid vessel 127 may have an advantage of lesser complexity, while adding and removing fluid to and from the fluid vessel 127 may have an advantage of maintaining the deformation of the surface 115 without the need for additional energy (if valves or other lockable mechanisms are used). When used with a mobile phone device, the displacement device 130 preferably increases the volume of the fluid 112 within the fluid vessel 127 by approximately 0.003-0.1 ml. When used with this or other applications, however, the volume of the fluid may be increased (or possibly decreased) by any suitable amount. The variations of the displacement device 130 described below refer to modifying the volume of the fluid to expand the cavity 125, but may be applied to any other suitable portion of the fluid vessel 127.

Figure 5A:
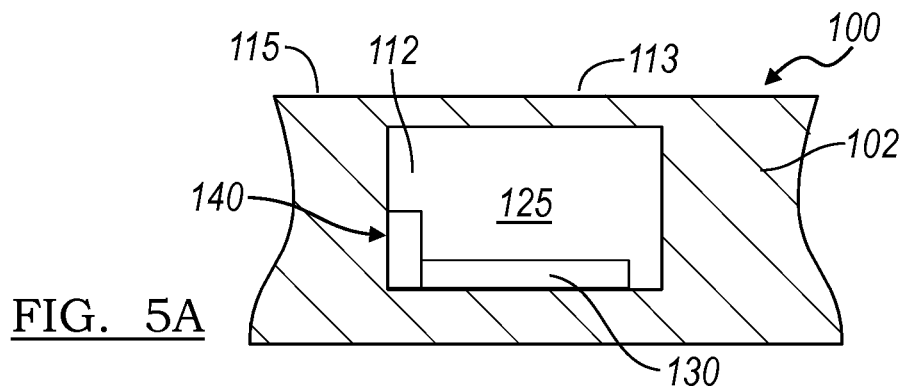
FIGS. 5a and 5b are cross-sectional views of the sheet, the fluid vessel, the sensor, and a displacement device that modifies the existing fluid in the cavity, with the cavity in a retracted volume setting and an expanded volume setting, respectively.
Figure 5B:
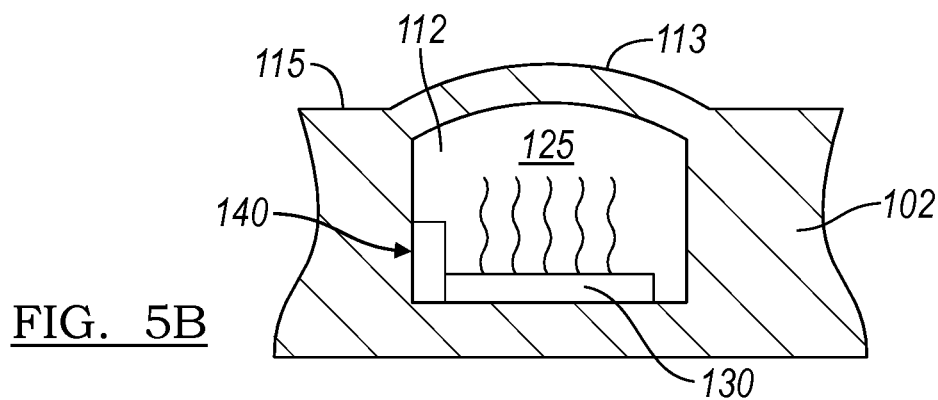

Modifying the existing fluid in the cavity 125 may be accomplished in several ways. In a first example, as shown in FIGS. 5a and 5b, the fluid may be an expandable fluid and the displacement device 130 may include a heating element that heats the expandable fluid, thereby expanding the volume of the existing fluid in the cavity 125 (according to the ideal gas law, PV=nRT). The heating element, which may be located within, adjacent the cavity 125, or any other location suitable to providing heat to the fluid, is preferably a resistive heater (made of a material such as TaN or Nichrome). In a second example, the fluid may include an expandable substance, such as plastic expandable microspheres. In a third example, the fluid may include paraffin. While these are three examples, the displacement device 130 can be any other suitable device or method that ultimately expands the cavity 125 from the retracted volume setting to the extended volume setting by modifying the existing fluid in the cavity 125.

Figure 6:
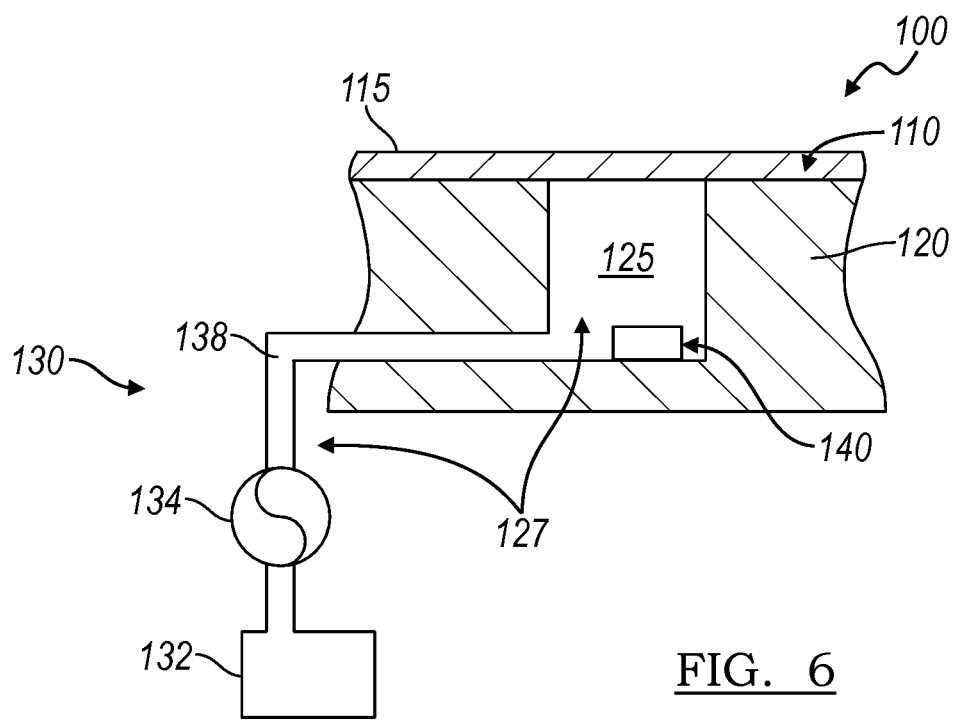
FIG. 6 is a schematic view of the sheet, the fluid vessel, the sensor, and a displacement device of a first example that displaces additional fluid into the cavity.
Figure 7:
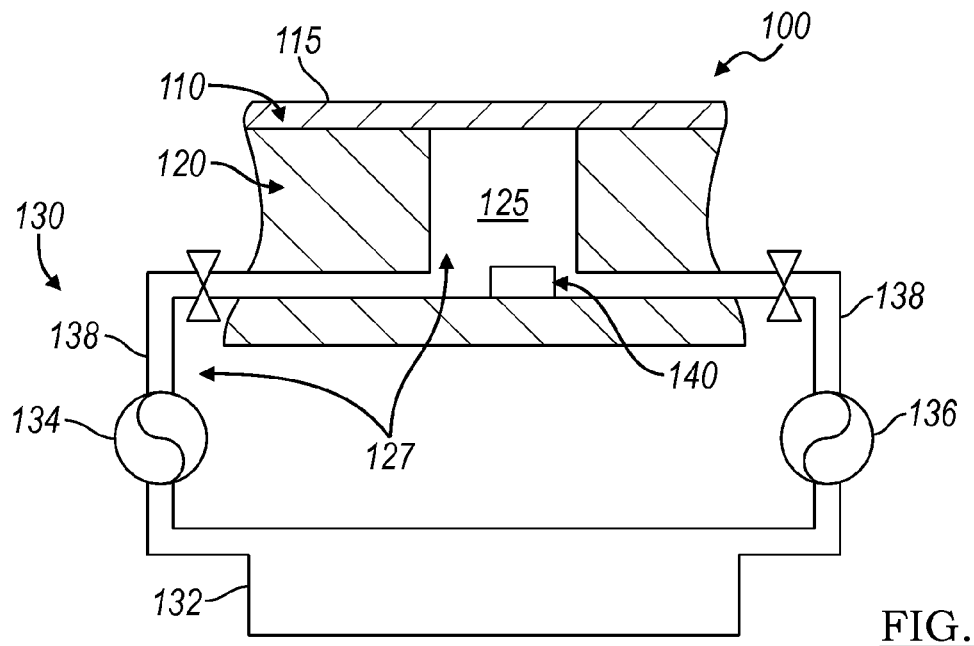
FIG. 7 is a schematic view of the sheet, the fluid vessel, the sensor, and a displacement device of a second example that displaces additional fluid into the cavity.
Figure 8A:
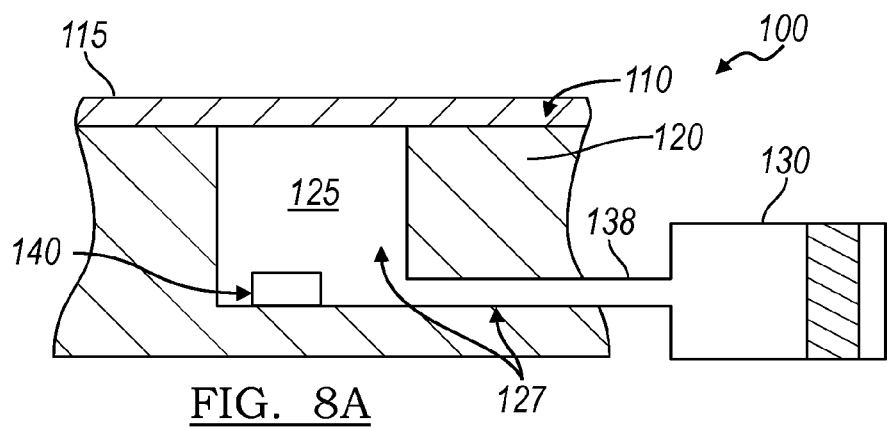
FIGS. 8a and 8b are schematic views of the sheet, the fluid vessel, the sensor, and a displacement device of a third example that displaces additional fluid into and out of the cavity, with the cavity in a retracted volume setting and an expanded volume setting, respectively.
Figure 8B:
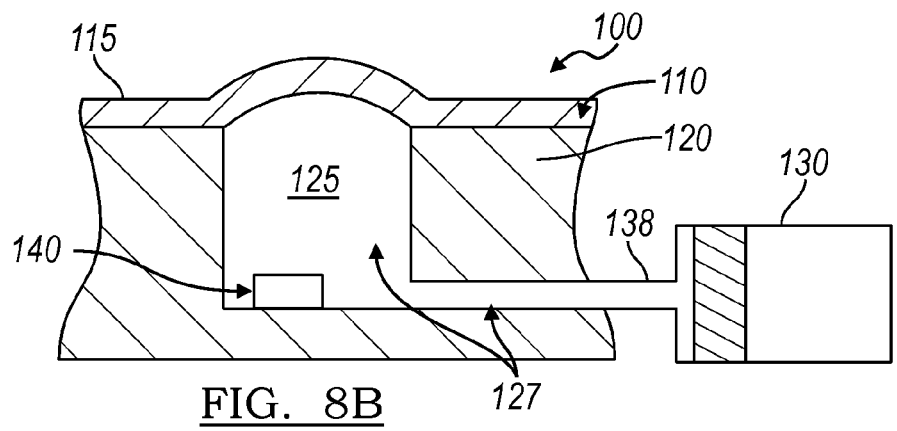

Adding and removing fluid to and from the cavity 125 may also be accomplished in several ways. In a first example, as shown in FIG. 6, the displacement device 130 includes a reservoir 132 to hold additional fluid and a pump 134 to displace fluid from the reservoir 132 to the cavity 125. The reservoir 132 is preferably remote from the cavity 125 (and connected by a channel 138 or other suitable device), but may alternatively be located adjacent the cavity 125 and connected directly to the cavity 125. A portion of the channel 138 is preferably a micro-fluidic channel (having cross-section dimensions in the range of 1 micrometer to 1000 micrometers), but depending on the size and costs constraints of the user interface system 100, the channel 138 may have any suitable dimensions. The pump 134 is preferably a micropump (such as pump #MDP2205 from ThinXXS Microtechnology AG of Zweibrucken, Germany or pump #mp5 from Bartels Mikrotechnik GmbH of Dortmund, Germany), but may be any suitable device to pump fluid from one location to another. The pump 134 is preferably located at a distance from the cavity 125, and is preferably connected to the cavity 125 by a channel 138. To extend the cavity 125 from a retracted volume setting to the extended volume setting, the pump 134 displaces fluid from a reservoir 132, through the channel 138, and into the cavity 125. To retract the cavity 125 from the extended volume setting to the retracted volume setting, the pump 134 preferably "vents" or pumps in a reverse direction from the cavity 125 to the reservoir 132. In a second example, as shown in FIG. 7, the displacement device 130 includes a reservoir 132 to hold additional fluid, a first pump 134 to displace fluid from the reservoir 132 to the cavity 125, a second pump 136 to displace fluid from the cavity 125 to the reservoir 132, a first valve located between the first pump 134 and the cavity 125, and a second valve located between the cavity 125 and the second pump 136. To extend the cavity 125 from the retracted volume setting to the extended volume setting, the first valve is opened, the second valve is closed, and the first pump 134 displaces fluid from the reservoir 132, through the channel 138, and into the cavity 125. To retract the cavity 125 from the extended position to the retracted position, the first valve is closed, the second valve is opened, and the second pump 136 displaces fluid from the cavity 125, through the channel 138, and into the reservoir 132. In other respects, the second example is similar to the first example above. The user interface system 100 may omit the second pump 136 and simply retract the cavity 125 from the extended volume setting to the retracted volume setting by opening the second valve and allowing the cavity 125 to vent or "drain" into the reservoir 132 (potentially assisted by the elasticity of the sheet 102 returning to an un-deformed state). In a third example, as shown in FIGS. 8a and 8b, the displacement device 130 includes an actuator, such as a linear actuator, that displaces fluid into and out of the cavity 125. To extend the cavity 125 from a retracted volume setting to the extended volume setting, as shown in FIG. 8a, the linear actuator displaces fluid through the channel 138 and into the cavity 125. To retract the cavity 125 from the extended volume setting to the retracted volume setting, as shown in FIG. 8b, the linear actuator draws fluid in a reverse direction from the cavity 125 to the reservoir 132. In other respects, the third example is similar to the second example above. While these are three examples, the displacement device 130 can be any other suitable device or method that ultimately expands the cavity 125 from the retracted volume setting to the extended volume setting by adding and removing fluid to and from the cavity 125.

Although the cause of the deformation of a particular region 113 of the surface 115 has been described as a modification of the volume of the fluid in the cavity 125, it is possible to describe the cause of the deformation as an increase in the pressure below the surface 115 relative to the pressure above the surface 115. When used with a mobile phone device, an increase of approximately 0.1-10.0 psi between the pressure below the sheet 102 relative to the pressure above the sheet 102, is preferably enough to deform a particular region 113 of the surface 115. When used with this or other applications, however, the modification of the pressure may be increased (or possibly decreased) by any suitable amount.

3. The Deformation of the Surface

As shown in FIG. 2, The fluid vessel 127 of the preferred embodiment functions to hold a volume of fluid 112 and to have at least two volumetric settings: a retracted volume setting (as shown in FIG. 2a for the variation of the fluid vessel 127 that includes a cavity 125) and an expanded volume setting (shown in FIG. 2b for the variation of the fluid vessel 127 that includes a cavity 125). Alternatively, there may be a plurality of volume settings or a dynamic range of volume settings. The fluid 112 is preferably a substantially incompressible fluid, but may alternatively be a compressible fluid. The fluid 112 is preferably a liquid (such as water, glycerin, or ethylene glycol), but may alternatively be a gas (such as air, nitrogen, or argon) or any other substance (such as a gel or aerogel) that expands the cavity 125 and deforms the surface 115. The fluid 112 may also function to direct selected wavelengths of light, such as UV light, to desired portions of the sheet 102, due to wavelength specific refractive index changes. In the extended volume setting, the cavity 125 deforms the particular region 113 of the surface 115 above the plane of the other regions of the surface 115. When used with a mobile phone device, the cavity 125 preferably has a diameter of 2-10 mm. When used with this or other applications, however, the cavity 125 may have any suitable dimension.

The shape of the deformation of the particular region 113 is preferably one that is felt by a user through their finger and preferably acts as (1) a button that can be pressed by the user (as shown in FIG. 9), (2) a slider that can be pressed by the user in one location along the slider or that can be swept in a sliding motion along the slider (such as the "click wheel" of the Apple iPod (second generation)) (as shown in FIGS. 10 and 11), and/or (3) a pointing stick that can be pressed by the user from multiple directions and/or locations along the surface whereby the user is provided with tactile feedback that distinguishes a first directional touch from a second directional touch and/or a touch in a first location from a touch in a second location (such as the pointing stick trademarked by IBM as the TRACKPOINT and by Synaptics as the TOUCH-STYK (which are both informally known as the "nipple")) (as shown in FIG. 12). The deformation may, however, act as any other suitable device or method that provides suitable tactile guidance and feedback. In the variation including a display 150, the shape of the deformation of the particular region 113 also preferably functions to minimize the optical distortion of the image underneath the deformed particular region 113.

4. The Sensor

The sensor 140 is preferably a resistive sensor 140 that is preferably arranged in one of four preferred embodiments: a first and a second preferred embodiment that includes a tactile layer that includes the sheet 102, the volume of fluid 112, and/or the displacement device 130 and a resistive touch sensitive layer 500 that is external to the tactile layer that functions as the resistive sensor 140; a third preferred embodiment where the resistive sensor is integrated into the fluid vessel 127; and a fourth preferred embodiment where the sheet 102 is integrated into a resistive touch sensitive layer 500a (or, in other words, a resistive touch sensitive layer that includes deformable regions).

In the first and second preferred embodiments, as shown in FIG. 13, the resistive touch sensitive layer 500 of the preferred embodiments (as seen from a side view) preferably includes a top layer 501 that is relatively pliable (for example, a plastic material such as PET) and preferably includes a first set of electrical conductors 511 and preferably a bottom layer 503 that that is relatively un-pliable (for example, a glass material) and includes a second set of electrical conductors 513. The first set of electrical conductors 511 may include a conductive coating on the bottom surface of the top layer 501 and a voltage gradient applied across the conductive surface in a horizontal direction and the second set of electrical conductors 513 may include a second conductive coating on the top surface of the bottom layer 503 and a second voltage gradient applied across the second conductive surface in a vertical direction. When a user deforms the top pliable layer 501 towards the bottom un-pliable layer 503 (as shown by the arrow and the dotted deformation in FIG. 13) the distance between the first and second sets of electrical conductors decrease and may come into contact or into proximity with each other proximal to the location where the user deforms the top layer, affecting the resistance between the first and second conductors, and the location and the presence of a user input is detected by evaluating the signals from the electrical conductors. Alternatively, the top layer 501 may include a conductor that includes a detectable electrical property that changes with the shape of the conductor and/or the strain experienced by the conductor. For example, as a user deforms the top layer 501 the conductor of the top layer 501 may change shape from the force provided by the user and/or experience strain from the force provided by the user, which may affect the electrical property of the conductor. This change in electrical property may be detected to detect a user input. However, any other suitable type of detection of the user input using a top layer 501 that deforms relative to the bottom layer 503 with the user input may be used. The resistive touch sensitive layer 500 preferably also includes spacers 505 that separate the top and bottom layers 501 and 503 to prevent undesired contact between the first and second sets of electrical conductors. The spacers 505 may include a top spacer and a bottom spacer. The top spacer may be mounted or otherwise coupled to the top layer 501 and the bottom spacer may be mounted or otherwise coupled to the bottom layer 503, and then assembled together to form the spacer 505.

Figure 14A:
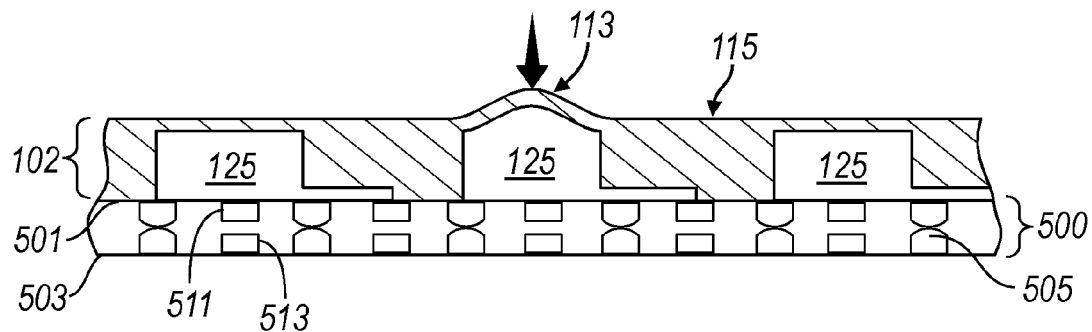
FIGS. 14a, 14b, and 14c are schematic representations of a variation of the first preferred embodiment.
Figure 14B:
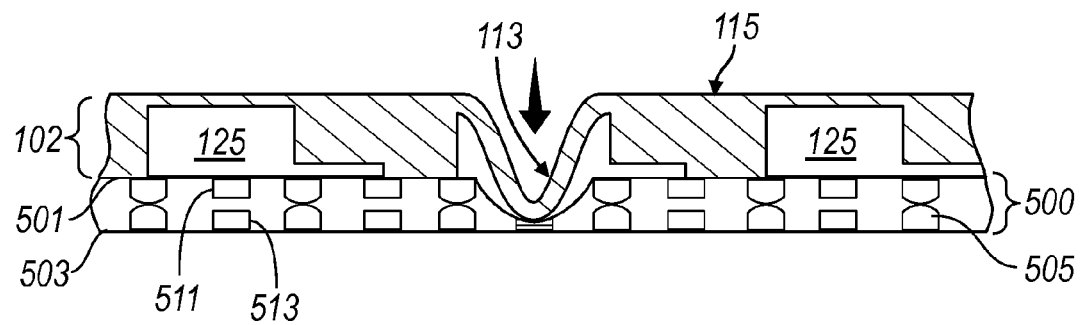
Figure 14C:
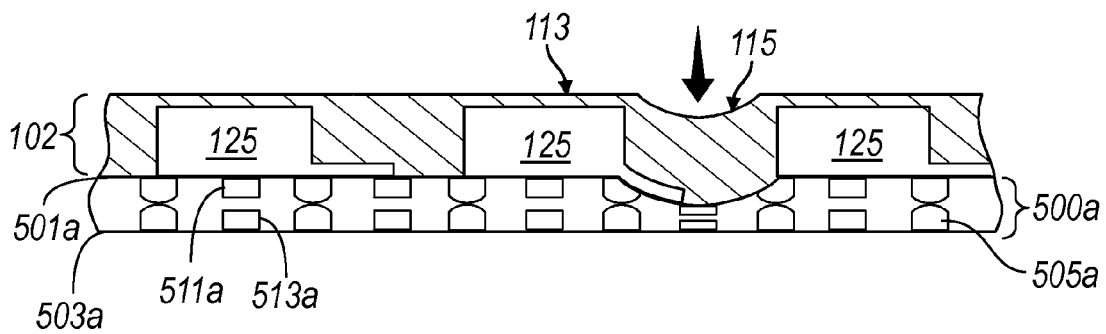

In the first preferred embodiment as shown in FIGS. 14a and 14b, the resistive touch sensitive layer 500 functions as the resistive sensor 140 and is external to the sheet 102. The resistive touch layer 500 and the sheet 102 is preferably arranged such that an inward deformation the particular region 113 of the sheet 102 extends beyond the bottom surface of the sheet 102 and comes into contact with and deforms the top layer 501 of the resistive touch sensitive layer 500 to cause contact or proximity between the top layer 501 and the bottom layer 503 of the resistive touch sensitive layer 500, as shown in FIG. 14b. The deformation of the top of the cavity 125 may be a deformation from the expanded state as well as a deformation from the retracted state. As shown in FIG. 14c, deformation of the surface 115 at a location other than the particular region 113 may also cause the top layer 501 to move towards and/or come into contact with the bottom layer 503. The top layer 501 of the first preferred embodiment is preferably composed of a material that is substantially pliable to facilitate the user in providing an input by decreasing the amount of force necessary to deflect both the deformed surface 113 of the sheet 102 and the top layer 501. The top layer 501 may alternatively be of a material thickness that allows for substantial pliability. The same material but of different thicknesses may be used between the sheet 102 and the top layer 501, which may facilitate coupling the sheet 102 to the resistive touch sensitive layer 500. Additionally, because the sheet 102 is placed over the resistive touch sensitive layer 500, the top layer 501 may be less likely to be accidentally flexed to cause undesired contact between the top layer 501 and the bottom layer 503 and a more pliable material may be used for the top layer 501.

The cavity 125 portion of the fluid vessel 127 of the sheet 102 may be arranged with no particular relationship with the spacers 505 of the resistive touch sensitive layer 500. In other words, the cavity 125 may be sized and arranged within the sheet 102 without substantial regard for the location of the spacers 505. Alternatively, the cavity 125 portion of the fluid vessel 127 may be substantially aligned in between at least two of the spacers 505 of the resistive touch sensitive layer 500. As shown in FIG. 14a, each cavity 125 may span the distance between two spacers 505, but may alternatively span the distance between three, four, or any other suitable number of spacers 505 to achieve a suitable surface area of the corresponding particular region 113. For example, the spacers 505 may be spaced substantially close together such that a cavity 125 that spans the distance between two spacers 505 may be too small to be distinguished by the finger of the user and, to decrease manufacturing difficulty and increase tactile guidance to the user, the cavity 125 may span across several spacers 505. In this variation, inward deformation of any portion of the particular region 113 preferably causes the top layer 501 to come into contact with the bottom layer 503 at the location corresponding to the inwardly deformed portion of the particular region 113. Because the particular region 113 may span over a larger portion of the top layer 501, a larger portion of the first and second sets of sensors of the resistive touch sensitive layer 500 may be included within the region occupied by the particular region 113, which may allow user inputs at a first portion of the particular region 113 to be distinguishable from a second portion of the particular region 113, allowing detection of directional input and/or regional input along the particular region 113. For example, in the variation where the deformation of the particular region 113 functions as a directional pointing stick as shown in FIG. 12, the detection of the location of the contact between the top layer 501 and the bottom layer 503 relative to the overall geometry of the deformed particular region 113 may indicate the direction input desired by the user. Alternatively, to increase flexibility in the tactile guidance provided to the user, the cavity 125 may span the distance between two spacers 505 and a combination of the expansion of several cavities 125 in relative close proximity with each other and their corresponding particular surfaces 113 may be used to provide tactile guidance to the user. However, any other suitable arrangement between the spacers 505 and the cavity 125 may be used.

Figure 15A:
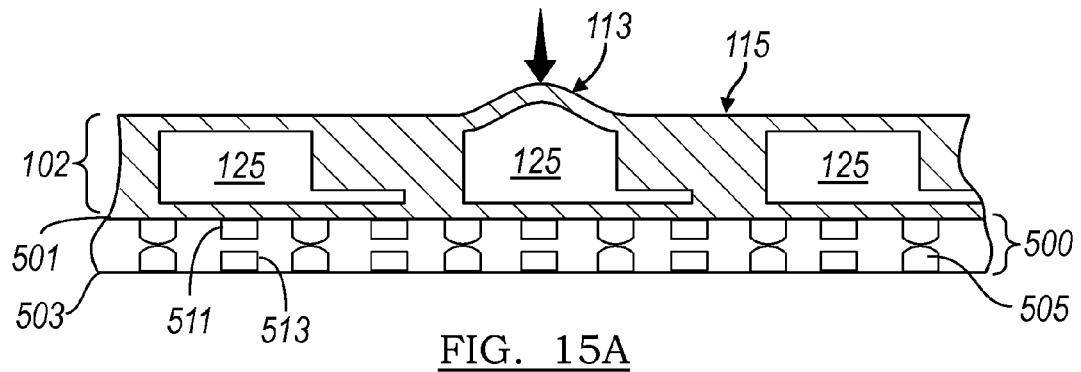
FIGS. 15a, and 15b are schematic representations of a variation of the second preferred embodiment.

In a first variation of the first preferred embodiment, the top layer 501 may function as the bottom boundary of the fluid vessel 127, as shown in FIGS. 14a and 14b. In a second variation of the first preferred embodiment, the sheet 102 may alternatively fully define the fluid vessel 127, as shown in FIG. 15a, where the inward deformation of the sheet 102 when the user provides a user input preferably comes into contact with the bottom of the cavity 125, deflects the bottom of the cavity 125, and then deforms the top layer 501 of the resistive touch sensitive layer 500 to cause contact between the top layer 501 and the bottom layer 503. In this second variation of the preferred embodiment, to provide an input, the user provides a force to inwardly deform the top of the cavity 125, the bottom of the cavity 125, and the top layer 501. Thus, a substantially pliable material is preferably used for the top layer 501 at the location corresponding to the particular region 113 to decrease the total force required of the user. In addition, in the variation where the sheet 102 is composed of a plurality of layers, the bottom of the cavity 125 may be composed of a material that is relatively more pliable than the other layers of the sheet 102. However, any other suitable materials for the sheet 102 and the top layer 501 may be used.

The sheet 102 is preferably mechanically coupled to the top layer 501 of the resistive touch sensitive layer 500. An adhesive such as epoxy, pressure-sensitive adhesive, or transparent double-sided tape may be used. Alternatively, the sheet 100 and the top layer 501 may be made of material that may be bonded using a welding process such one that uses heat, ultrasonic waves, or high pressure. The sheet 102 and the top layer 501 may also be plasma treated to prepare for bonding. However, any other suitable method or material used to mechanically couple the sheet 102 to the top layer 501 may be used. The bottom surface of the sheet 102 may be substantially continuously coupled to the top layer 501, but may alternatively include portions of the surface that are coupled and portions of the surface that are left uncoupled to the top layer 501. For example, in the second variation where the sheet 102 fully defines the cavity 125 as shown in FIG. 15a, as the inward deformation of the sheet 102 pushes against the top layer 110 as the user provides an input, the material of the bottom of the cavity 125 and the material of the top layer 501 may stretch and change shape at different rates and different locations, respectively, potentially causing relative movement between the sheet 102 and the top layer 110. If this relative movement were prevented by fully bonding the bottom of the cavity 125 to the top layer 501, the user may not be able to cause the top layer 501 to come into contact with the bottom layer 503 and a user input will not be registered. To allow for the relative movement, the sheet 102 is preferably bonded to the top layer 501 at portions of the bottom surface of the sheet 102 that do not deform and/or portions of the bottom surface of the sheet 102 that do not correspond to locations on the top layer 501 that deform. Alternatively, the bottom of the cavity 125 and the top layer 501 may be fully bonded and the geometric and/or material differences between the bottom of the cavity 125 and the top layer 501 may be utilized to allow the top layer 501 to suitably move towards the bottom layer 503 to register a user input. In a second example, the sheet 102 and top layer 501 may include features that facilitate coupling and the sheet 102 and the top layer 501 may be coupled only at the locations where the features are present. For example, in the variation where the sheet 102 and the top layer 501 are coupled using an ultrasonic welding process, a geometry that functions as an energy director to concentrate the energy from the ultrasonic welding process may be built into the sheet 102 to facilitate coupling at the location of the energy director. In a third example, the sheet 102 and top layer 501 may each include a secondary material that facilitates bonding between the sheet 102 and top layer 501. For example, to achieve a desired pliability of the sheet 102 and the top layer 501, materials that have substantially low bonding properties may be selected. To sufficiently bond the sheet 102 and the top layer 501, a secondary material (such as Acrylonitrile butadiene styrene (ABS) or Styrene Acrylonitrile (SAN) in the case of ultrasonic welding) may be coupled to each of the sheet 102 and the top layer 501 and then bonded together to couple the sheet 102 to the top layer 501. In a third example, a selective coating may be used between the sheet 102 and the resistive touch sensitive layer 500. For example, the coating may be placed over an adhesive to prevent adhesion between certain portions of the sheet 102 and the top layer 501 or an adhesive may be selectively coated onto the bottom of the surface 110 and/or the top layer 501 to function as an adhesive in the desired locations. However, any other suitable arrangement of the coupling of the sheet 102 to the top layer 501 may be used.

Figure 15B:
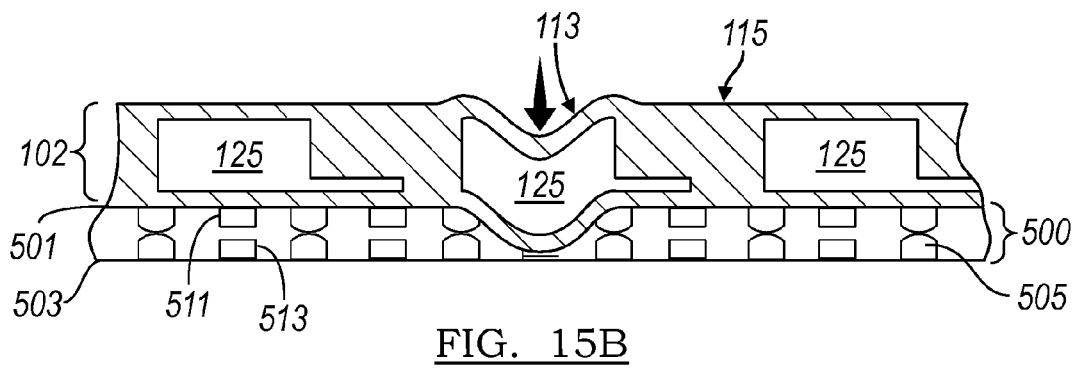
Figure 16A:
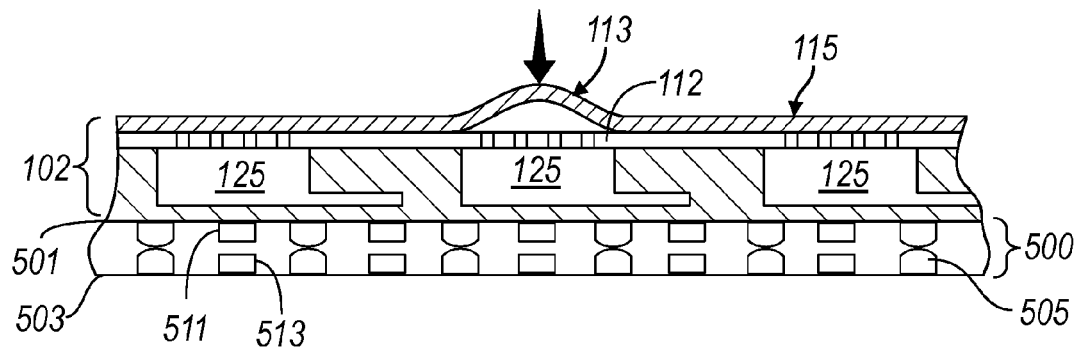
FIGS. 16a, and 16b are schematic representations of a variation of the second preferred embodiment with a fluid outlet layer.
Figure 16B:
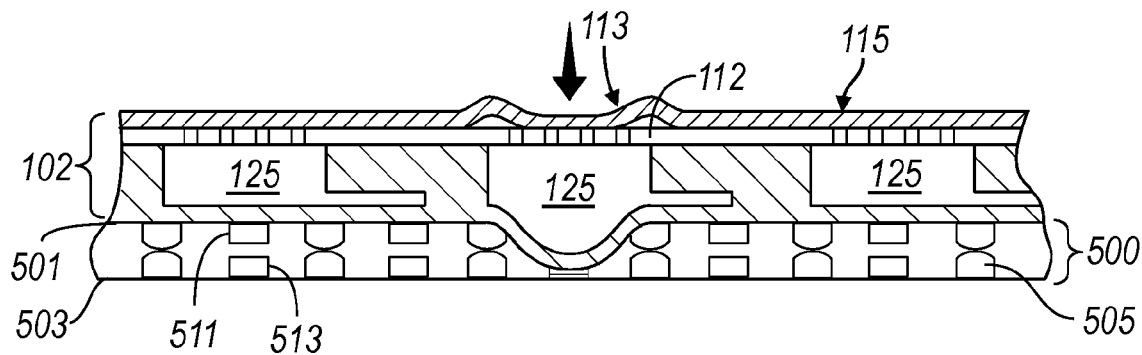

The second preferred embodiment, as shown in FIGS. 15 and 16, is substantially similar to the first preferred embodiment. The resistive sensor is included into a resistive touch sensitive layer 500 that is preferably of the type as described above and the sheet 102 is placed over the resistive touch sensitive layer 500. In the second preferred embodiment, however, the inward deformation of the top of the cavity 125 of the sheet 102 does not extend beyond the bottom surface of the sheet 102. In the second preferred embodiment, the volume of the fluid 112 is preferably static inside the cavity 125 once the cavity 125 has been expanded (for example, through the use of a valve as mentioned above in the description for the displacement device 130). The fluid 112 is preferably also incompressible, thus allowing the inward deformation of the particular region 113 to cause corresponding downward deformation of the bottom of the cavity 125, which in turn pushes against the top layer 501 and causes contact between the top layer 501 and the bottom layer 503. This decreases the amount of inward deformation of the particular region 113 required of the user in order to provide a user input. As in the first preferred embodiment, a user input may be detected at locations on the surface 115 other than at the particular region 113. In the variation of the sheet 102 that includes a fluid outlet layer, as shown in FIGS. 4a, 16a, and 16b, the second preferred embodiment allows the inward deformation of the particular region 113 to cause the bottom layer of the cavity 125 to move the top layer 501 towards the bottom layer 503 without the inward deformation of the particular region 113 going past the support element 112, as shown in FIG. 16b. Alternatively, the support element 112 may also inwardly deform while providing the desired support for the particular region 113. In this second preferred embodiment, because of the additional energy necessary to displace the fluid 112 and to deform the bottom of the cavity 125 (in addition to potential imperfections in the sealing of the cavity 125 and the fluid 112 not being truly incompressible), the top layer 501 is preferably composed of a relatively pliable material. Similar to the second variation of the first preferred embodiment, the bottom of the cavity 125 may be made of a relatively more pliable material than the rest of the sheet 102 while still less pliable than the top of the cavity 125 such that the expansion of the cavity 125 by the displacement device 130 will not cause the bottom of the cavity 125 to expand out into the top layer 501 and cause undesired inputs. As in the first preferred embodiment, the pliability characteristics of the layers may be adjusted through material selection and/or material thickness selection. Because of this feature, the balance of pliability characteristics between the top of the cavity 125, the bottom of the cavity 125, and the top layer 501 in the second preferred embodiment has a significant impact on the function and feel of the user interface system 100. However, any other suitable material may be used. The portion of the bottom of the cavity 125 that is pliable may alternatively be of a smaller surface area than the particular region 113, allowing a smaller inward displacement of the top of the cavity 125 to achieve a larger inward displacement of the bottom of the cavity 125 for the same volume of fluid that is displaced. In all other respects, the user interface system of the second preferred embodiment is preferably similar or identical to the first preferred embodiment.

Figure 17A:
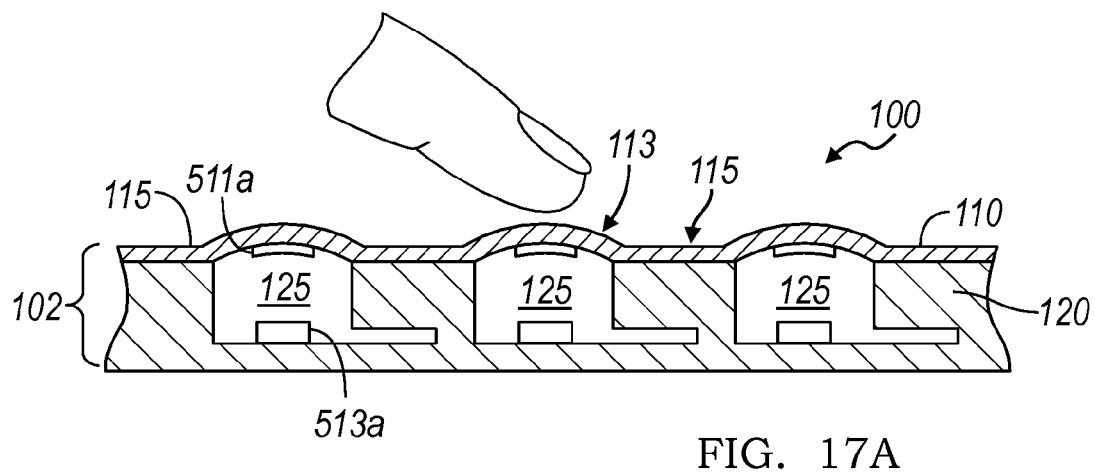
FIGS. 17a and 17b are schematic representations of a variation of the third preferred embodiment.
Figure 17B:
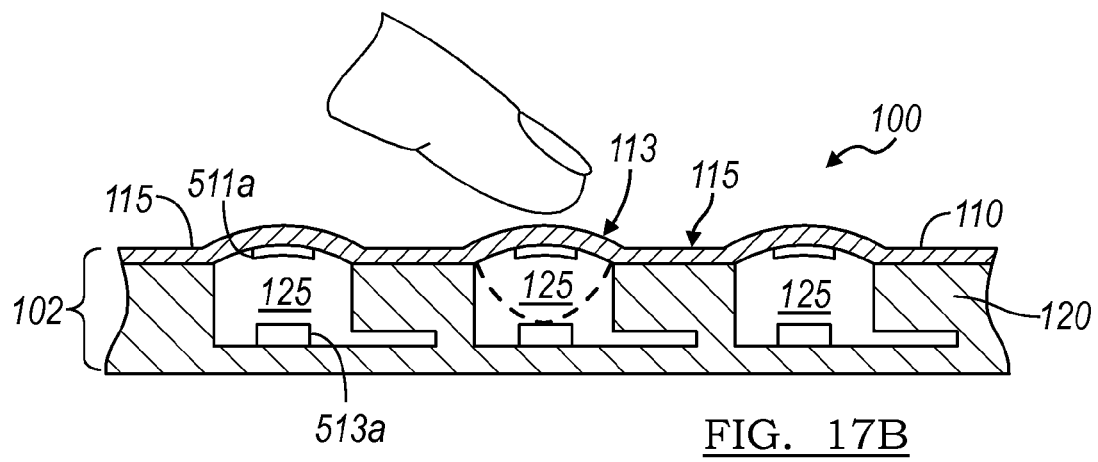

In the third preferred embodiment, as shown in FIGS. 17a and 17b, the resistive sensor 140 is integrated into the sheet 102. A first electrical conductor 511a is preferably located in an upper portion of the sheet 102 and a second electrical conductor 513a is preferably located at a lower portion of the sheet 102. In a preferred variation, the first electrical conductor 511a is preferably located at the top of the cavity 125 and a second electrical conductor 513a is preferably locate at the bottom of the cavity 125, as shown in FIG. 17a. However, the first and second electrical conductors 511a and 513a may be located in a region other than the particular region 113 and/or the fluid vessel 127 to allow detection of a user input outside of the particular region 113 and/or the fluid vessel 127. In the variation of the sheet 102 that includes a support element 112 as shown in FIG. 13, the second electrical conductor 513a may alternatively be located at the support element 112. As the user inwardly deforms the particular region 113, the top of the cavity 125 is pushed towards the bottom of the cavity 125 and, upon contact or close proximity of the first and second electrical conductors 511a and 513a, a user input is detected by the resistive sensor 140, as shown in FIG. 17b. In the variation where the first and second electrical conductors 511a and 513a are located in a region other than the particular region 113 and/or the fluid vessel 127, the material of the sheet 102 may be compressible to allow for a user force to compress the material to bring the first and second electrical conductors 511a and 513a into contact or close proximity. In the variation where the sheet 102 is composed of a plurality of layers of either the same material or of different materials, the first and second electrical conductors 511a and 513b are preferably layered into the sheet 102 during the manufacturing process. Alternatively, in the variation where the sheet 102 is composed of a layer portion 110 and a substrate portion 120 as shown in FIGS. 4, 17a, and 17b, the first electrical conductor 511a may be bonded or coated onto the underside of the layer portion 110 and into the bottom of the cavity 125 of the substrate portion 120. However, any other suitable arrangement of the first and second conductors 511a and 513a may be used.

To decrease the visibility of the first and second electrical conductors 511a and 513a, the electrical conductors 511a and 513b are preferably transparent and/or with a refractive index that is matched with the sheet 102 and/or the fluid 112. The electrical conductors 511a and 513b may alternatively be substantially thin and relatively difficult to perceive with the human eye (for example, 10 microns wide). This is particularly useful when the user interface system is placed over a display 150 and the image displayed by the display 150 is preferably transmitted uniformly through the user interface system. The first electrical conductor 511a is also preferably a flexible material to allow the top of the cavity 125 to extend down to contact or approach the bottom of the cavity 125. A transparent conductive oxide such as indium-tin-oxide (ITO), Al-doped zinc oxide (AZO), or Zn-doped indium oxide (IZO) may be used as transparent flexible electrical conductors. Alternatively, conductive polymers, conductive ink, or wire or any other material that is difficult to see with the human eye may be used. However, any other suitable conductor may be used for the first and second electrical conductors 511a and 513a.

In the variation where the first and second electrical conductors are located within the fluid vessel 127 and/or the particular region 113, the first and second electrical conductors are preferably located within the expanding portion of the fluid vessel 127, for example, the cavity 125. In particular, the first electrical conductor is preferably located in a substantially central location on the top of the cavity 125 and/or at a substantially central location relative to the particular region 113, which are areas that are relatively easy to displace (as compared to the perimeter of the top of the cavity 125 and the particular region 113), thus facilitating the user in providing a user input. Additionally, in the variation where the deformation of the particular region 113 functions as a button, locating the first electrical conductor 511a in a substantially centralized location on the top of the cavity 125 and/or particular region 113 is particularly useful because the user may also be inclined to provide a user input by inwardly deforming the portion of the particular region 113 that is substantially in the center. Alternatively, the first electrical conductor 511a may be located across the substantially the entire top of the cavity 125 such that an input from any location along the top of the cavity 125 and/or the particular region 113 may be detected. Yet alternatively, the first electrical conductor 511a may be located only in certain portions of the top of the cavity 125 such that user input only at locations of the particular region 113 that correspond to the certain portions of the top of the cavity 125 that include the first electrical conductor may be detected. In this variation, the first electrical conductor 511a may include geometry that corresponds to the desired detectable locations of the top of the cavity 125. However, any other suitable arrangement of the first electrical conductor 511a may be used.

The second electrical conductor 513a is preferably located in substantially central to the bottom of the cavity 125 because, as the user provides a user input by inwardly deforming the particular region 113, the deforming portion of the sheet 102 may be guided towards the central portion of the bottom of the cavity 125 by the side walls of the cavity 125. Alternatively, the second electrical conductor may be located substantially across the entire bottom of the cavity 125 such that contact or proximity with the first electrical conductor 511a at any location along the bottom of the cavity 125 may be detected. Yet alternatively, the second electrical conductor may be located across the side walls of the cavity 125 to allow any contact or proximity with the first electrical conductor 511a along the side walls of the cavity 125 to be detected as a user input. This may allow user input to be detected with a smaller displacement of the first electrical conductor 511a relative to the second electrical conductor. The smaller displacement may decrease the forced required to provide a user input. In this variation, the second electrical conductor 513a may be located on both the bottom and the side walls of the cavity 125 or may alternatively be located only on the side walls of the cavity 125. Similarly to the first electrical conductor 511a, the second electrical conductor 513a may be located only in certain portions of the bottom and/or the side walls of the cavity 125 such that contact with the top of the cavity 125 only at locations of the bottom and/or side walls of the cavity 125 that include the second electrical conductor 513a may be detected. In this variation, the second electrical conductor 513a may include geometry that corresponds to the desired detectable locations of the bottom and/or side walls of the cavity 125. However, any other suitable arrangement of the second electrical conductor 513a may be used.

Each cavity 125 may include one first and one second electrical conductors 511a and 513a. Each cavity 125 may alternatively include one first electrical conductor 511a that corresponds with a plurality of second electrical conductors 513a or vice versa. For example, a primary second electrical conductor 513a may be located on the bottom of the cavity 125, a secondary second electrical conductor 513a may be located on the side walls of the cavity 125, and one first electrical conductor 511a may be located on the top of the cavity 125. In this variation, an inward deformation of the top of the cavity 125 from a force substantially perpendicular to the surface 115 will cause the first electrical conductor to come into contact or close proximity with the primary second electrical conductor 513a at the bottom of the cavity 125 while an inward deformation of the top of the cavity 125 from a force that is not substantially perpendicular to the surface 115 will cause the first electrical conductor 511a to come into contact or close proximity with the secondary second electrical conductor 513a on a side wall of the cavity 125. This may allow for the user interface system to detect the direction of a user input. Additionally, each wall may include a separate second electrical conductor 513a to further increase the ability to determine the direction of the user input. Alternatively, a plurality of second electrical conductors 513a may be included on the bottom of the cavity 125 or on each of the side walls of the cavity 125. In a reverse relationship, one second electrical conductor 513a may be located on the bottom and/or the side walls of the cavity 125 and a plurality of first electrical conductors 511a may be located on the top of the cavity 125 to achieve a similar directional detection of user input. Similarly, each cavity 125 may alternatively include a plurality of first and second electrical conductors 511a and 513a and the detection of contact between any first and any second electrical conductor may indicate the direction or any other suitable information on the user input. However, any other suitable arrangement or number of first and second electrical conductors 511a and 513a may be used.

Figure 18A:
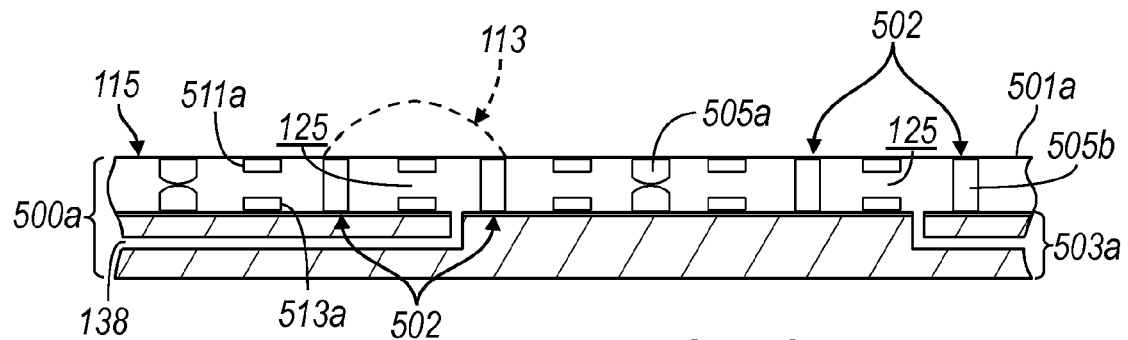
FIGS. 18a-18c are schematic representations of a variation of the fourth preferred embodiment.
Figure 18B:
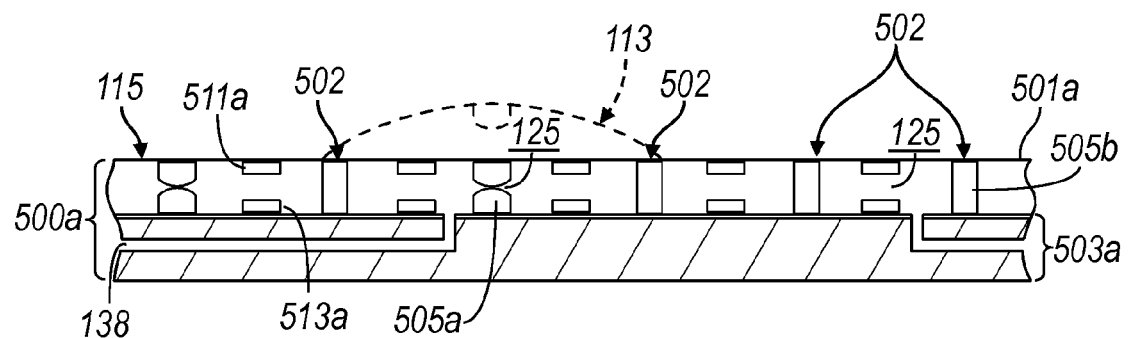
Figure 18C:
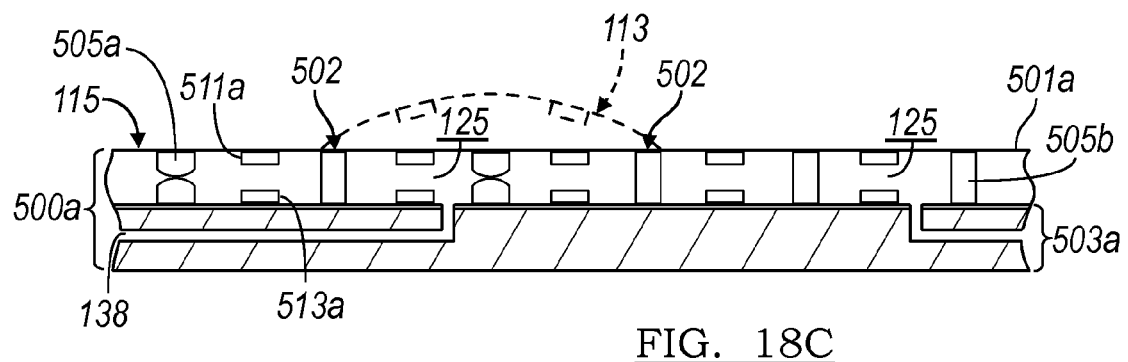

In the fourth preferred embodiment as shown in FIGS. 18a, 18b and 18c, the user interface system is integrated into a resistive touch sensitive layer, as shown in the integrated resistive touch sensitive layer 500a in FIG. 18, that provides substantially accurate detection of the locations of user inputs. The fourth preferred embodiment may alternatively be thought of as a resistive touch sensitive layer with surface deforming capabilities. As shown in FIG. 18a, the fourth preferred embodiment preferably utilizes the construction of a resistive touch sensitive layer as described above with a top layer 501a, a bottom layer 503a, spacers 505a, a first set of electrical conductors 511a, and a second set of electrical conductors 513a. The fourth preferred embodiment preferably also includes a seal 502 that cooperates with the top and bottom layers 501a and 503a to at least partially define a fluid vessel between the top layer and the bottom layer. The region of the top and bottom layers 501a and 503a that cooperate with the seal to define the fluid vessel 127 preferably includes at least a portion of the first and second set of conductors such that an input at the fluid vessel 127 is detectable. To increase the sensitivity to the location of the user input relative to the particular region 113 (or other portions of the fluid vessel 127), a larger portion of the first and second set of conductors may be included within the particular region 113 (or other portions of the fluid vessel 127) of the defined fluid vessel 127. In other words, if the first and second set of conductors can distinguish between a first user input and a second user input that are at a minimum distance of X apart, a particular region 113 is preferably larger than X to distinguish a first user input at a first location relative to the particular region 113 and a second user input at a second location relative to the particular region 113. The user interface system 100 may also include a fluid outlet layer as described above between the top layer 501a and the bottom layer 503a. In this fourth preferred embodiment, the top layer 501a functions to define the surface 115 and cooperate with the spacers 505a and the bottom layer 503a to form the sheet 102 and to define the fluid vessel 127. The fluid vessel 127 is then filled with a fluid 112 and preferably expands (as shown by the dotted line representing the expanded particular region 113 in FIG. 18a) and retracts with manipulation of the volume of the fluid 112 similarly or identically to the fluid vessel 127 as described above. The first set of electrical conductors 511a preferably also expands along with the top layer 501a. Alternatively, the first electrical conductors 511a may be located on the fluid outlet layer that remains relatively stationary and may not expand along with the top layer 501a. However, any other suitable arrangement of the electrical conductors may be used.

The seal 502 is preferably formed using the spacers 505a. In the preferred embodiments, the spacers 505a are preferably bonded to the top layer 501a and/or the bottom layer 503a to form a substantially leak tight fluid vessel. As shown in FIG. 18, a portion of the fluid vessel 127 (such as the channel 138) may be substantially defined by the bottom layer 503a that is coupled to a channel 138 while the expanding portion of the fluid vessel 127 (such as the cavity 125) is cooperatively defined by the top layer 501a, bottom layer 503a, and the seal 502. Such bonded spacers 505a are hereafter referred to as "boundary-spacers." In the variation where the spacers 505a are composed of a top component and a bottom component which are then assembled to form the spacer 505a, the top component and the bottom component are preferably fused together to form a continuous spacer 505b that is substantially leak tight wall to the fluid vessel 127 to form the seal 502, as shown in FIGS. 18a, 18b, and 18c. Similar to the methods used to bond the sheet 102 to the top layer 501 discussed in the first preferred embodiment, spacers 505a (and the top and bottom components of the spacers 505b, where appropriate) may be bonded to the top layer 501a and the bottom 503a using heat welding, ultrasonic welding, or any other suitable process that creates a substantially leak tight seal. However, the seal 502 may alternatively be assembled into the space between the top and bottom layers 501a and 503a and may be separate from the spacers 505a. For example, the seal 502 may be a balloon that is assembled into the resistive touch sensitive layer 500a and the top and bottom layers 501a and 503a may function to shape the balloon into the fluid vessel 127. However, any other suitable seal may be used to define the fluid vessel 127.

As shown in FIG. 18a, a cavity 125 and/or the fluid vessel 127 may span the space in between two spacers 505. Alternatively, because the number and frequency of spacers 505a may be related to the desired flatness of the surface 115 and the optical quality of the sheet 102 (for example, the higher the number and the higher the frequency of spacers 505a, the flatter the surface 115, the flatter the surface 115, the higher the optical quality of the sheet 102), the spacers 505a may be located at such a close proximity to each other that the corresponding particular region 113 to a cavity 125 and/or fluid vessel 127 that spanned between only two spacers 505a would most likely not be felt by the finger of a user. In this variation, the cavity 125 may span the space between three, four, or any other suitable number of spacers 505 to achieve a suitably sized cavity 125 and corresponding particular region 113, as shown in FIG. 18b. To achieve the larger span of the cavity 125, the spacers 505a that are in between the boundary-spacers 505b of the cavity 125 are preferably not bonded to the top and bottom layers 501a and 503a to form a leak tight seal, allowing the fluid 112 to communicate throughout the volume of the desired cavity 125 such that manipulation of the volume of fluid 112 within the fluid vessel 127 will expand the fluid vessel 127 and cause the particular region 113 to deform outward. The expansion of the fluid vessel 127 preferably causes the top layer 501a to separate from the spacer that does not define the wall of the fluid vessel 127. Alternatively, the spacer 505a may also stretch and elongate to follow the expansion of the fluid vessel 127. In this variation of the spacer 505a, the spacer 505a is preferably composed of a substantially pliable material, function to manipulate the shape of the deformation of the particular region 113 and/or preferably maintain refractive properties to decrease visibility as the material stretches. Yet alternatively, in the variation of the spacer 505a that is composed of a top component and a bottom component, the top component may expand with the top layer 501a, as shown by the dotted line representing the particular region 113 in FIG. 18b. However, any other suitable bonding and expansion arrangement between a non-boundary-spacer 505a and the top layer 501a may be used. Alternatively, as shown in FIG. 18c, the non-boundary-spacers 505a may be removed. An advantage provided by this variation is that a user input that inwardly deforms the particular region 113 will not be hindered by the presence of spacers within the cavity 125. Alternatively, to increase flexibility in the tactile guidance provided to the user, the cavity 125 and/or fluid vessel 127 may span the distance between two spacers 505a and a combination of the expansion of several cavities 125 in relative close proximity with each other and their corresponding particular surfaces 113 may be used to provide tactile guidance to the user. The user interface system may also include a combination of various sizes of cavities 125 (as shown in FIGS. 18b and 18c). However, any other suitable size of cavity 125 relative to the spacers 505 may be used.

As shown in FIGS. 18a, 18b, and 18c, the boundary-spacers 505b preferably function to at least partially define one the fluid vessel 127 in only a portion of the top and bottom layers 501a and 503a. In other words, there is at least a space in the resistive touch sensitive layer 500 in between two boundary-spacers 505b that does not contain a fluid vessel 127. To decrease the visible difference between portions of the user interface 125 that include the fluid vessel 127 and portions that do not include the fluid vessel 127, the portions that do not include a fluid vessel 127 may also be filled with the fluid 112 or a fluid with substantially similar optical properties to the fluid 112 to allow light to refract through the sheet 100 in a substantially uniform manner. The portions that do not include a fluid vessel 127 may alternatively be filled with a gas, another type of fluid, or any other suitable material that allows for substantially uniform refraction of light through the sheet 102.

The top layer 501a is preferably composed of a flexible material that allows the expansion and retraction of the cavity 125 and the deformation of the particular region 113 (such as the materials mentioned above in the description for the sheet 102). The material of the top layer 501a is also preferably of the type that allows for conductor sets 511a and 513a that allow for substantially accurate sensing capabilities in the user interface system 100 to be used. However, any other suitable material may be used for the top layer 501a.

The bottom layer 503a is preferably composed of a material that allows for conductor sets 511a and 513a that allow for substantially accurate sensing capabilities in the user interface system 100 to be used. Additionally, the bottom layer 503a may be composed of a material and of a material thickness that allows for the bottom layer 503a to include a channel 138, as described above. The channel 138 may be fluidly coupled to the displacement device 130 to allow for the passage of fluid 112 in the second variation of the displacement device 130. As mentioned above, the bottom layer 503a is typically made of a glass material. To accommodate for the channel 138, the bottom layer 503a may be composed of a plurality of layers of a silicone material, an elastomeric material, or any of the materials mentioned in the description for the sheet 102 that is unpliable relative to the top layer 501a to allow for inward deformation of the top layer 501a to cause the first set of electrical conductors 511a to come into contact with the second set of electrical conductors 513a. However, any other suitable material may be used for the bottom layer 503a.

The substantially accurate sensing capabilities due to the arrangement of first and second electrical conductors 511a and 513a of the resistive touch sensitive layer 500a may allow the user interface system to detect more accurately the details of a user input, for example, the direction, the location of the user input relative to the geometry of the particular region 113, the proportion of the surface area of the particular region 113 upon which the user is providing an inward deformation force, the occurrence of multiple user inputs (commonly known as "multi-touch"), the rate the inward deformation of the particular region 113 (for example, when the user causes contact between the first and second sets of electrical conductors 511a and 513a, because of the shape of the finger of the user, certain conductors will come into contact before others, and the time lapse in between contact events can be used to determine the rate of the inward deformation of the particular region 113), or any other suitable detail of the user input.

As described above, the sensor 140 is preferably a resistive sensor of an embodiment described above. Alternatively, the sensor 140 may be any other suitable type of sensor that senses a user input based on the deformation of a top layer 501 or 501a that results from a user input provided on the surface 115. For example, the first and second set of electrical conductors 511, 511a, 513, and/or 513a may function as capacitive sensors that emit and detect an electromagnetic field and that detect that capacitance and/or change in capacitance between the first and second set of conductors to detect a user input. In other words, as the user deforms the top layer 501 or 501a, the capacitance between the portions of the first and second set of conductors substantially proximal to the location of the user input may change. The change in capacitance may be the result of the change in the distance between the first and second set of conductors substantially proximal to the location of the user input, but may alternatively be the result of the change in the volume of fluid 112 between the first and second set of conductors substantially proximal to the location of the user input. In this variation, the fluid 112 may function as a dielectric between the first and second sets of conductors that provides a variable capacitance between the first and second sets of conductors as the volume of fluid 112 between the conductors changes. This may be particularly applicable in variations of the fluid 112 that are electrically conducting or insulating that may affect the electromagnetic coupling between the first and second set of conductors, for example, fluids with conductive/insulative properties, fluids that include suspensions or dispersions of particles with relevant relevant electrical and optical properties, or any other suitable type of fluid. Alternatively, the material of the sheet 102 may function as a dielectric between the first and second sets of conductors that changes as the force of the user input deforms the sheet 102. However, any other suitable material within the use interface system 100 may function as a variable dielectric as the user provides a user input that deforms the top layer. In a second example, the first and second set of electrical conductors 511, 511a, 513, and/or 513a may function as an inductive sensor where one of the first and second set of electrical conductors emit an electromagnetic field and the other of the first and second set of electrical conductors functions as a conductor that modifies the electromagnetic field in a detectable manner (for example, as the top layer moves closer or farther away from the bottom layer) and a user input is detected. However, any other suitable type of detection of the user input using a top layer 501 that deforms relative to the bottom layer 503 with the user input may be used.

As a person skilled in the art will recognize from the previous detailed description and from the figures and claims, modifications and changes can be made to the preferred embodiments of the invention without departing from the scope of this invention defined in the following claims.

We claim:

1. A user interface system for receiving a user input comprising:
    a tactile layer including a sheet that defines a surface and at least partially defines a fluid vessel arranged underneath the surface, a volume of fluid within the fluid vessel, and a displacement device that influences the volume of fluid within the fluid vessel to expand and retract a portion of the fluid vessel in order to deform a particular region of the surface, wherein the tactile layer receives an input on the surface that inwardly deforms the particular region; and
    a touch sensitive layer arranged substantially underneath the tactile layer and comprising a first layer and a second layer;
    wherein the first layer is interposed between the tactile layer and the second later, forms a bottom surface of the fluid vessel, comprises a first conductor, and deforms inwardly in response to the input on the surface of the tactile layer,
    wherein the second layer is coupled to the first layer opposite the tactile layer and comprises a second conductor electrically coupled to the first conductor, and
    wherein a detectable electrical property between the first conductor and the second conductor changes in response to a change in a distance between the first conductor and the second conductor.

2. The user interface system of claim 1, wherein the electrical property comprises an electrical resistance between the first conductor and the second conductor.

3. The user interface system of claim 1, further comprising a processor that detects the electrical property between the first conductor and the second conductor and detects a user input on the surface based on a change in the electrical property between the first conductor and the second conductor responsive to a change in a distance between the first layer and the second layer changes.

4. The user interface system of claim 1, wherein the touch sensitive layer detects an input applied to the tactile layer, that inwardly deforms the expanded particular region of the surface, and that inwardly deforms the first layer toward the second layer.

5. The user interface system of claim 4, wherein the touch sensitive layer detects a property of inward deformation of the first layer toward the second layer from the group consisting of: a degree of inward deformation, a speed of inward deformation, and a direction of inward deformation.

6. The user interface system of claim 4, wherein the particular region contacts the first layer in response to the input on the surface.

7. The user interface system of claim 4, wherein the particular region indirectly deforms the first layer inward in response to the input on the surface.

8. The user interface system of claim 7, wherein the volume of fluid is substantially static within the fluid vessel and is substantially incompressible, and wherein the particular region shifts the volume of fluid within the fluid vessel to deform the first layer.

9. The user interface system of claim 1, further comprising a display coupled to the touch sensitive layer and outputting images through the tactile layer to the user.

10. The user interface system of claim 9, wherein the display is arranged substantially underneath the touch sensitive layer opposite the tactile layer, and wherein the touch sensitive layer cooperates with the sheet to transmit an image through the tactile layer.

11. The user interface system of claim 1, wherein the first conductor includes an array of conductors.

12. The user interface system of claim 11, wherein conductors within the array of conductors cooperate to detect a property of the input selected from the group consisting of: a degree of inward deformation, a speed of inward deformation, and a direction of inward deformation.

13. The user interface system of claim 1, wherein the sensor detects a first input applied to a first portion of the particular region of the surface and detects a second input applied to a second portion of the particular region of the surface, the second input distinct from the first input.

14. The user interface system of claim 13, wherein the sensor comprises a resistive sensor, and wherein the first conductor comprises a first region proximal the first portion of the particular region with a first resistance relative to the second conductor and comprises a second region proximal the second portion of the particular region with a second resistance relative to the second conductor.

15. A user interface system for receiving a user input comprising:
    a sheet that defines a surface and a fluid vessel arranged underneath the surface;
    a volume of fluid within the fluid vessel;
    a displacement device that influences the volume of fluid within the fluid vessel to expand and retract a portion of the fluid vessel to deform a particular region of the surface; and a sensor comprising a first conductor and a second conductor, wherein the first conductor is coupled to an upper surface of the fluid vessel proximal the particular region and is electrically coupled to the second conductor, wherein the second conductor is coupled to a bottom surface of the fluid vessel, wherein a distance between the first conductor and the second conductor decreases in response to an input on the sheet that inwardly deforms the surface at the particular region and that moves the upper surface of the fluid vessel toward the bottom surface of the fluid vessel, and wherein an electrical property between the first conductor and the second conductor changes in response to the decrease in the distance between the first conductor and the second conductor.

16. The user interface system of claim 15, wherein the electrical property comprises an electrical resistance between the first conductor and the second conductor.

17. The user interface system of claim 15, further comprising a processor that detects the input that inwardly deforms the surface based on the change in the electrical property between the first conductor and the second detector.

18. The user interface system of claim 15, wherein the sheet is substantially compressible, and wherein the input compresses the sheet to decrease the distance between the upper portion of the sheet and the lower portion of the sheet.

19. The user interface system of claim 15, further comprising a display arranged underneath the sheet and outputting images through the sheet.

20. The user interface system of claim 19, wherein the sensor cooperates with the volume of fluid and the sheet to transmit an image rendered on the display through the sheet.

21. A touch sensitive user interface layer comprising:

a first layer that defines a surface;

a second layer arranged substantially underneath the first layer;

a sensor comprising a first set of conductors and a second set of conductors, wherein the first set of conductors is arranged within first layer, and wherein the second set of conductors is arranged within second layer and is electrically coupled to the first set of conductors;

a plurality of spacers that are arranged between the first layer and the second layer, that maintain a distance between the first layer and the second layer, and that enable a first conductor in the first set of conductors to move toward a second conductor in the second set of conductors to receive an input on the surface;

a seal that cooperates with the first layer and the second layer to define a fluid vessel between the first layer and the second layer, wherein a portion of the first set of conductors and the second set of conductors are arranged adjacent the fluid vessel;

a first volume of fluid contained within the fluid vessel;

a second volume of fluid arranged between the first layer and the second layer separate from the fluid vessel; and a displacement device that influences the first volume of fluid within the fluid vessel to expand and contract a portion of the fluid vessel to deform a particular region of the surface;

wherein a first spacer in the plurality of spacers is mounted to the first layer, a second spacer in the plurality of spacers is mounted to the second layer, and the first spacer contacts the second spacer when the portion of the fluid vessel is contracted;

wherein the first spacer is separated from the second spacer when the portion of the fluid vessel is expanded;

wherein a distance between the first conductor and the second conductor decreases in response to the input on the surface; and wherein an electrical property between the first conductor and the second conductor changes in response to a decrease in the distance between the first conductor and the second conductor.

22. The touch sensitive layer of claim 21, further comprising a processor that detects the electrical property between the first conductor and the second conductor and detects the input on the surface based on the change in the electrical property.

23. The touch sensitive layer of claim 22, wherein the processor detects the electrical property that comprises an electrical resistance between the first conductor and the second conductor.

24. The touch sensitive layer of claim 22, wherein the processor detects a property of the input applied to the expanded particular region of the surface selected from the group consisting of: a degree of inward deformation, a speed of inward deformation, and a direction of inward deformation.

25. The touch sensitive layer of claim 21 wherein the second volume of fluid is substantially optically similar to the first volume of fluid contained within the fluid vessel.

26. The touch sensitive layer of claim 22, wherein the processor detects the location of the input based on the electrical property detected between a subset of the first set of conductors and a subset of the second set of conductors.

27. The touch sensitive layer of claim 21, wherein the second conductive layer defines a portion of the fluid vessel.

28. The touch sensitive layer of claim 21, wherein the fluid vessel is fluidly coupled to the displacement device by a fluid channel.

29. The touch sensitive layer of claim 21, further comprising a display arranged substantially underneath the surface and outputting images through the first layer.

30. The touch sensitive layer of claim 29, wherein the first volume of fluid cooperates with the first layer, the second layer, the first set of conductors, the second set of conductors, and the plurality of spacers to transmit an image through the first layer to a user.

* * * * *